United States Patent
Wang et al.

(10) Patent No.: US 11,195,443 B2
(45) Date of Patent: Dec. 7, 2021

(54) LATCH AND DRIVE METHOD THEREOF, SOURCE DRIVE CIRCUIT AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventors: Jiguo Wang, Beijing (CN); Jun Fan, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 16/707,212

(22) Filed: Dec. 9, 2019

(65) Prior Publication Data

US 2020/0111399 A1 Apr. 9, 2020

Related U.S. Application Data

(63) Continuation-in-part of application No. PCT/CN2018/076079, filed on Feb. 9, 2018.

(30) Foreign Application Priority Data

Jul. 26, 2017 (CN) .......................... 201710620428.X

(51) Int. Cl.
  *G09G 3/36* (2006.01)
  *G09G 3/20* (2006.01)
  *H03K 3/037* (2006.01)

(52) U.S. Cl.
  CPC .............. *G09G 3/20* (2013.01); *H03K 3/0375* (2013.01); *G09G 2310/0286* (2013.01)

(58) Field of Classification Search
  USPC .................... 345/92, 208, 98, 100; 257/372; 327/208; 714/724; 326/47; 237/208,
  (Continued)

(56) References Cited

U.S. PATENT DOCUMENTS 4,580,066 A * 4/1986 Berndt ........... G01R 31/318541
                                                   326/40
5,798,746 A 8/1998 Koyama
(Continued)

FOREIGN PATENT DOCUMENTS

CN       1490654 A     4/2004
CN       1928682 A     3/2007
(Continued)

OTHER PUBLICATIONS

Dong Wang, et al; CMOS Very Large Scale Integrated Circuit Design; China Power Press; Apr. 30, 2006; pp. 17-19 of the text, figures 1-31-1-32.
(Continued)

*Primary Examiner* — Thuy N Pardo
(74) *Attorney, Agent, or Firm* — Fay Sharpe LLP

(57) ABSTRACT

Provided are a latch and a drive method thereof, a source drive circuit and a display device. The latch includes: a first latch circuit and a second latch circuit; the first latch circuit is connected to a first control signal terminal, a data signal terminal and a transmission node, and is configured to latch a data signal from the data signal terminal at a first latch node and transmit the data signal to the transmission node; and the second latch circuit is connected to the transmission node, a first switch signal terminal, a second switch signal terminal and an output node, and is configured to latch a data signal from the transmission node at a second latch node and output the data signal to the output node; a loop in the second
(Continued)

latch circuit is turned off in response to the data signal written to the second latch node.

20 Claims, 11 Drawing Sheets

(58) Field of Classification Search
USPC ............... 237/170, 202; 365/72; 348/731
See application file for complete search history.

(56) References Cited

U.S. PATENT DOCUMENTS

| | | | | |
|---|---|---|---|---|
| 2002/0079543 | A1* | 6/2002 | Yokozeki | G11C 7/1048 257/372 |
| 2003/0210219 | A1* | 11/2003 | Osame | G09G 3/30 345/92 |
| 2004/0041764 | A1 | 3/2004 | Koyama et al. | |
| 2006/0262062 | A1* | 11/2006 | Osame | G09G 3/30 345/92 |
| 2007/0052646 | A1 | 3/2007 | Ishiguchi | |
| 2007/0216631 | A1 | 9/2007 | Nojiri | |
| 2007/0284619 | A1* | 12/2007 | Kanno | G11C 5/063 257/207 |
| 2008/0062113 | A1 | 3/2008 | Kim | |
| 2009/0027097 | A1* | 1/2009 | Kanno | H03K 3/356008 327/208 |
| 2009/0249141 | A1* | 10/2009 | Yasuda | G01R 31/31727 714/724 |
| 2011/0148463 | A1* | 6/2011 | Kato | H01L 27/1225 326/47 |
| 2013/0057315 | A1* | 3/2013 | Kato | H01L 21/8258 326/47 |
| 2013/0249613 | A1* | 9/2013 | Kitagawa | H03K 19/018521 327/170 |
| 2013/0285998 | A1 | 10/2013 | Hong et al. | |
| 2013/0321709 | A1* | 12/2013 | Daigle | H03K 3/356191 348/731 |
| 2014/0218089 | A1* | 8/2014 | Javerliac | H03K 3/037 327/202 |
| 2015/0213846 | A1* | 7/2015 | Nakagawa | G11C 14/0054 365/72 |
| 2016/0226471 | A1* | 8/2016 | Kato | H03K 3/356104 |
| 2018/0123568 | A1* | 5/2018 | Rasouli | H03K 3/356156 |

FOREIGN PATENT DOCUMENTS

| | | |
|---|---|---|
| CN | 100437304 C | 11/2008 |
| CN | 201928259 U | 8/2011 |
| CN | 101399019 B | 3/2012 |
| CN | 103377628 A | 10/2013 |
| CN | 103383841 A | 11/2013 |
| CN | 107180619 A | 9/2017 |
| JP | 2000352957 A | 12/2000 |
| JP | 2009222558 A | 10/2009 |
| KR | 20040020844 A | 3/2004 |

OTHER PUBLICATIONS

International search report of PCT application No. PCT/CN2018/076079 dated May 8, 2018.
First office action of Chinese application No. 201710620428.X dated Jan. 23, 2019.
Second office action of Chinese application No. 201710620428.X dated Jun. 28, 2019.
Third office action of Chinese application No. 201710620428.X dated Oct. 18, 2019.
Notice of Preliminary Rejection of Korean application No. 10-2019-7037705 dated Dec. 16, 2020.
Examination report under sections 12 & 13 of the Patents Act of Indian application No. 201927052433 dated Feb. 12, 2021.

* cited by examiner

LATCH AND DRIVE METHOD THEREOF, SOURCE DRIVE CIRCUIT AND DISPLAY DEVICE

This application is a CIP of PCT Patent Application Serial No. PCT/CN2018/076079, filed on Feb. 9, 2018, which claims priority to Chinese Patent Application No.: 201710620428.X filed on Jul. 26, 2017 and entitled "LATCH AND DRIVE METHOD THEREOF, SOURCE DRIVE CIRCUIT AND DISPLAY DEVICE", the entire contents of which are incorporated herein by reference.

TECHNICAL FIELD

The present disclosure relates to the field of display technologies, and in particular to a latch and a drive method thereof, a source drive circuit and a display device.

BACKGROUND

A drive circuit of a display device generally includes a gate drive circuit and a source drive circuit. In the drive process, the gate drive circuit scans rows of pixel units in a display panel row by row, and the source drive circuit inputs data signals to columns of pixel units, to charge the pixel units.

In the related art, a source drive circuit is provided. The source drive circuit mainly includes a horizontal shift register and a plurality of latches. The horizontal shift register includes a plurality of cascaded shift register units, and each latch is connected to one stage of shift register unit. Each shift register unit in the horizontal shift register is configured to generate a pulse control signal, and input the pulse control signal to the corresponding latch. Each latch is configured to latch a data signal and output the data signal to a corresponding data signal line under control of the pulse control signal, to charge a column of pixel units.

SUMMARY

The present disclosure provides a latch and a drive method thereof, a source drive circuit and a display device. The technical solutions are as follows.

In an aspect, there is provided a latch, comprising:

a first latch circuit connected to a first control signal terminal, a data signal terminal and a transmission node, the first latch circuit configured to, under control of a first pulse control signal from the first control signal terminal, latch a data signal from the data signal terminal at a first latch node and transmit the data signal to the transmission node; and a second latch circuit connected to the transmission node, a first switch signal terminal, and an output node, the second latch circuit configured to, under control of a first switch signal from the first switch signal terminal, latch a data signal from the transmission node at a second latch node and output the data signal to the output node;

wherein a loop in the second latch circuit is turned off in response to the data signal written to the second latch node.

Optionally, the first latch circuit is further connected to a second control signal terminal; the first latch circuit comprises:

a first switch sub-circuit connected to the first control signal terminal, the data signal terminal and the first latch node, the first switch sub-circuit configured to, under control of the first pulse control signal, transmit the data signal to the first latch node; and a first latch sub-circuit connected to the second control signal terminal, the first latch node and the transmission node, the first latch sub-circuit configured to, under control of a second pulse control signal from the second pulse control signal terminal, latch the data signal at the first latch node and transmit the data signal to the transmission node.

Optionally, the second latch circuit is further connected to a second switch signal terminal; the second latch circuit comprises:

a second switch sub-circuit connected to the first switch signal terminal, the transmission node and the second latch node, the second switch sub-circuit configured to, under control of the first switch signal, transmit the data signal from the transmission node to the second latch node; and a second latch sub-circuit connected to the second switch signal terminal, the second latch node and the output node, the second latch sub-circuit configured to, under control of a second switch signal from the second switch signal terminal, latch the data signal at the second latch node and transmit the data signal to the output node.

Optionally, the first switch sub-circuit comprises: a first transmission gate; the first latch sub-circuit comprises: a second transmission gate, a first inverter, a second inverter and a third inverter; wherein a first control terminal of the first transmission gate is connected to the first control signal terminal, a second control terminal of the first transmission gate is connected to the second control signal terminal, an input terminal of the first transmission gate is connected to the data signal terminal, and an output terminal of the first transmission gate is connected to the first latch node;

a first control terminal of the second transmission gate is connected to the second control signal terminal, a second control terminal of the second transmission gate is connected to the first control signal terminal, an input terminal of the second transmission gate is connected to an output terminal of the third inverter, and an output terminal of the second transmission gate is connected to the first latch node; and an input terminal of the first inverter is connected to the first latch node, an output terminal of the first inverter is connected to an input terminal of the second inverter and an input terminal of the third inverter, and an output terminal of the second inverter is connected to the transmission node;

wherein a first pulse control signal output from the first control signal terminal and a second pulse control signal output from the second control signal terminal are complementary signals.

Optionally, the first switch sub-circuit comprises: a first transistor; the first latch sub-circuit comprises: a second transistor, a first inverter, a second inverter and a third inverter; wherein a gate of the first transistor is connected to the first control signal terminal, a first electrode of the first transistor is connected to the data signal terminal, and a second electrode of the first transistor is connected to the first latch node;

a gate of the second transistor is connected to the second control signal terminal, a first electrode of the second transistor is connected to an output terminal of the third inverter, and a second electrode of the second transistor is connected to the first latch node; and an input terminal of the first inverter is connected to the first latch node, an output terminal of the first inverter is connected to an input terminal of the second inverter and an input terminal of the third inverter, and an output terminal of the second inverter is connected to the transmission node.

Optionally, the second switch sub-circuit comprises: a third transmission gate; the second latch sub-circuit comprises: a fourth transmission gate, a fourth inverter, a fifth inverter and a sixth inverter; wherein a first control terminal of the third transmission gate is connected to the first switch signal terminal, a second control terminal of the third transmission gate is connected to the second switch signal terminal, an input terminal of the third transmission gate is connected to the transmission node, and an output terminal of the third transmission gate is connected to the second latch node;

a first control terminal of the fourth transmission gate is connected to the second switch signal terminal, a second control terminal of the fourth transmission gate is connected to the first switch signal terminal, an input terminal of the fourth transmission gate is connected to an output terminal of the fifth inverter, and an output terminal of the fourth transmission gate is connected to the second latch node; and an input terminal of the fourth inverter is connected to the second latch node, an output terminal of the fourth inverter is connected to an input terminal of the fifth inverter and an input terminal of the sixth inverter, and an output terminal of the sixth inverter is connected to the output node;

wherein a loop formed by the fourth transmission gate, the fourth inverter and the fifth inverter is turned on in response to turning on of the fourth transmission gate, and a first switch signal output from the first switch signal terminal and a second switch signal output from the second switch signal terminal are complementary signals.

Optionally, the second switch sub-circuit comprises: a third transistor; the second latch sub-circuit comprises: a fourth transistor, a fourth inverter, a fifth inverter and a sixth inverter; wherein a gate of the third transistor is connected to the first switch signal terminal, a first electrode of the third transistor is connected to the transmission node, and a second electrode of the third transistor is connected to the second latch node;

a gate of the fourth transistor is connected to the second switch signal terminal, a first electrode of the fourth transistor is connected to an output terminal of the fifth inverter, and a second electrode of the fourth transistor is connected to the second latch node; and an input terminal of the fourth inverter is connected to the second latch node, an output terminal of the fourth inverter is connected to an input terminal of the fifth inverter and an input terminal of the sixth inverter, and an output terminal of the sixth inverter is connected to the output node;

wherein a loop formed by the fourth transistor, the fourth inverter and the fifth inverter is turned on in response to turning on of the fourth transistor.

Optionally, the second latch circuit further comprises: a buffer sub-circuit; wherein an input terminal of the buffer sub-circuit is connected to the second latch sub-circuit, and an output terminal of the buffer sub-circuit is connected to the output node.

Optionally, the buffer sub-circuit comprises: a seventh inverter and an eighth inverter connected in series; wherein an input terminal of the seventh inverter is connected to the second latch sub-circuit, and an output terminal of the seventh inverter is connected to an input terminal of the eighth inverter; and an output terminal of the eighth inverter is connected to the output node.

Optionally, the first latch circuit comprises: a first switch sub-circuit and a first latch sub-circuit; wherein the first switch sub-circuit comprises: a first transistor; the first latch sub-circuit comprises: a second transistor, a first inverter, a second inverter and a third inverter; the first transistor and the second transistor having opposite polarities;

wherein a gate of the first transistor is connected to the first control signal terminal, a first electrode of the first transistor is connected to the data signal terminal, and a second electrode of the first transistor is connected to the first latch node;

a gate of the second transistor is connected to the first control signal terminal, a first electrode of the second transistor is connected to an output terminal of the third inverter, and a second electrode of the second transistor is connected to the first latch node; and an input terminal of the first inverter is connected to the first latch node, an output terminal of the first inverter is connected to an input terminal of the second inverter and an input terminal of the third inverter, and an output terminal of the second inverter is connected to the transmission node.

Optionally, the second latch circuit comprises: a second switch sub-circuit and a second latch sub-circuit; wherein the second switch sub-circuit comprises: a third transistor; the second latch sub-circuit comprises: a fourth transistor, a fourth inverter, a fifth inverter and a sixth inverter; the third transistor and the fourth transistor having opposite polarities;

wherein a gate of the third transistor is connected to the first switch signal terminal, a first electrode of the third transistor is connected to the transmission node, and a second electrode of the third transistor is connected to the second latch node;

a gate of the fourth transistor is connected to the first switch signal terminal, a first electrode of the fourth transistor is connected to an output terminal of the fifth inverter, and a second electrode of the fourth transistor is connected to the second latch node; and an input terminal of the fourth inverter is connected to the second latch node, an output terminal of the fourth inverter is connected to an input terminal of the fifth inverter and an input terminal of the sixth inverter, and an output terminal of the sixth inverter is connected to the output node;

wherein a loop formed by the fourth transistor, the fourth inverter and the fifth inverter is turned on in response to turning on of the fourth transistor.

In another aspect, there is provided a method for driving a latch, wherein the latch comprises: a first latch circuit and a second latch circuit; the method comprising:

at a first latch stage, latching a data signal from a first data signal terminal at a first latch node and transmitting the data signal to a transmission node by the first latch circuit, wherein a first pulse control signal output from a first control signal terminal is at a first potential and a second potential in sequence; and at a second latch stage, latching a data signal from a transmission node at a second latch node and transmitting the data signal to an output node by the second latch circuit, wherein a first switch signal output from a first switch signal terminal is at a first potential and a second potential in sequence;

wherein at the second latch stage, a loop in the second latch circuit is turned off in response to the data signal written to the second latch nod.

Optionally, the first latch circuit is further connected to a second control signal terminal; the second latch circuit is further connected to a second switch signal terminal; the first latch circuit comprises: a first switch sub-circuit and a first latch sub-circuit; the second latch circuit comprises: a second switch sub-circuit and a second latch sub-circuit; and the first latch stage comprises:

at an input sub-stage, transmitting the data signal to the first latch node by the first switch sub-circuit under control of the first pulse control signal, wherein the first pulse control signal is at the first potential, and the first switch signal, a second pulse control signal output from a second control signal terminal and a second switch signal output from the second switch signal terminal are all at a second potential; and at a first latch sub-stage, latching the data signal at the first latch node and transmitting the data signal to the transmission node by the first latch sub-circuit under control of the second pulse control signal, wherein the first pulse control signal, the first switch signal and the second switch signal are all at the second potential and the second pulse control signal is at the first potential;

wherein the first pulse control signal output from the first control signal terminal and the second pulse control signal output from the second control signal terminal are complementary signals;

and the second latch stage comprises:

at a transmission sub-stage, outputting the data signal from the transmission node to the second latch node by the second switch sub-circuit under control of the first switch signal, wherein the first switch signal is at the first potential and the second switch signal the first pulse control signal and the second pulse control signal are all at a second potential, and a loop in the second latch sub-circuit is turned off; and at a second latch sub-stage, latching the data signal at the second latch node and transmitting the data signal to the output node by the second latch sub-circuit under control of the second switch signal, wherein the first switch signal, the first pulse control signal and the second pulse control signal are all at a second potential and the second switch signal is at the first potential, and the loop in the second latch sub-circuit is turned on;

wherein the first switch signal output from the first switch signal terminal and the second switch signal output from the second switch signal terminal are complementary signals.

Optionally, the first latch circuit comprises: a first switch sub-circuit and a first latch sub-circuit; the second latch circuit comprises: a second switch sub-circuit and a second latch sub-circuit; and the first latch stage comprises:

at an input sub-stage, transmitting the data signal to the first latch node by the first switch sub-circuit under control of the first pulse control signal, wherein the first pulse control signal is at the first potential and the first switch signal is at the second potential; and at a first latch sub-stage, latching the data signal at the first latch node and transmitting the data signal to the transmission node by the first latch sub-circuit under control of the second pulse control signal, wherein the first pulse control signal is at the second potential and the first switch signal is at the second potential;

the second latch stage comprises:

at a transmission sub-stage, transmitting the data signal from the transmission node to the second latch node by the second switch sub-circuit under control of the first switch signal, wherein the first switch signal is at the first potential and the first pule control signal is at the second potential; and at a second latch sub-stage, latching the data signal at the second latch node and transmitting the data signal to the output node by the second latch sub-circuit under control of the second switch signal, wherein the first switch signal is at the second potential, the first pulse control signal is at the second potential, and a loop in the second latch circuit is turned on.

In yet another aspect, there is provided a source drive circuit, comprising:

at least two cascaded first shift register units and at least two latches, an output terminal of each of the first shift register units being connected to a first control signal terminal of a corresponding latch;

wherein the latch comprises: a first latch circuit and a second latch circuit; wherein the first latch circuit is connected to a first control signal terminal, a data signal terminal and a transmission node, and is configured to, under control of a first pulse control signal from the first control signal terminal, latch a data signal from the data signal terminal and transmit the data signal to the transmission node; and the second latch circuit is connected to the transmission node, a first switch signal terminal, and an output node, and is configured to, under control of a first switch signal from the first switch signal terminal, latch a data signal from the transmission node and output the data signal to the output node;

wherein a loop in the second latch circuit is turned off in response to the data signal written to the second latch node.

Optionally, the source drive circuit further comprises: a plurality of inverter circuits; wherein the output terminal of each of the first shift register units is further connected to a second control signal terminal of a corresponding latch via an inverter circuit.

Optionally, each of the inverter circuits comprises: an inverter; wherein an input terminal of the inverter is connected to an input terminal of one first shift register unit, and an output terminal of the inverter is connected to a second control signal terminal of a corresponding latch.

Optionally, the source drive circuit further comprises: a second shift register unit cascaded to a last stage first shift register unit in the at least two cascaded first shift register units;

wherein an output terminal of the second shift register unit is connected to a first switch signal terminal of each of the at least two latches.

In still yet another aspect, there is provided a display device, comprising the source drive circuit described in the above aspect.

BRIEF DESCRIPTION OF THE DRAWINGS

In order to describe the technical solutions in the embodiments of the present more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

DETAILED DESCRIPTION

The present disclosure will be described in further detail with reference to the accompanying drawings, to present the objects, technical solutions, and advantages of the present disclosure more clearly.

In varied embodiments of the present disclosure, each of a plurality of signals corresponds to a first potential and a second potential. The first potential and the second potential merely represent two state quantities of the potential of the signal, instead of representing the first potential or the second potential in the whole text has a particular value. That is, the first potentials (or the second potentials) of varied signals may have the same potential value or different potential values.

Figure 1:
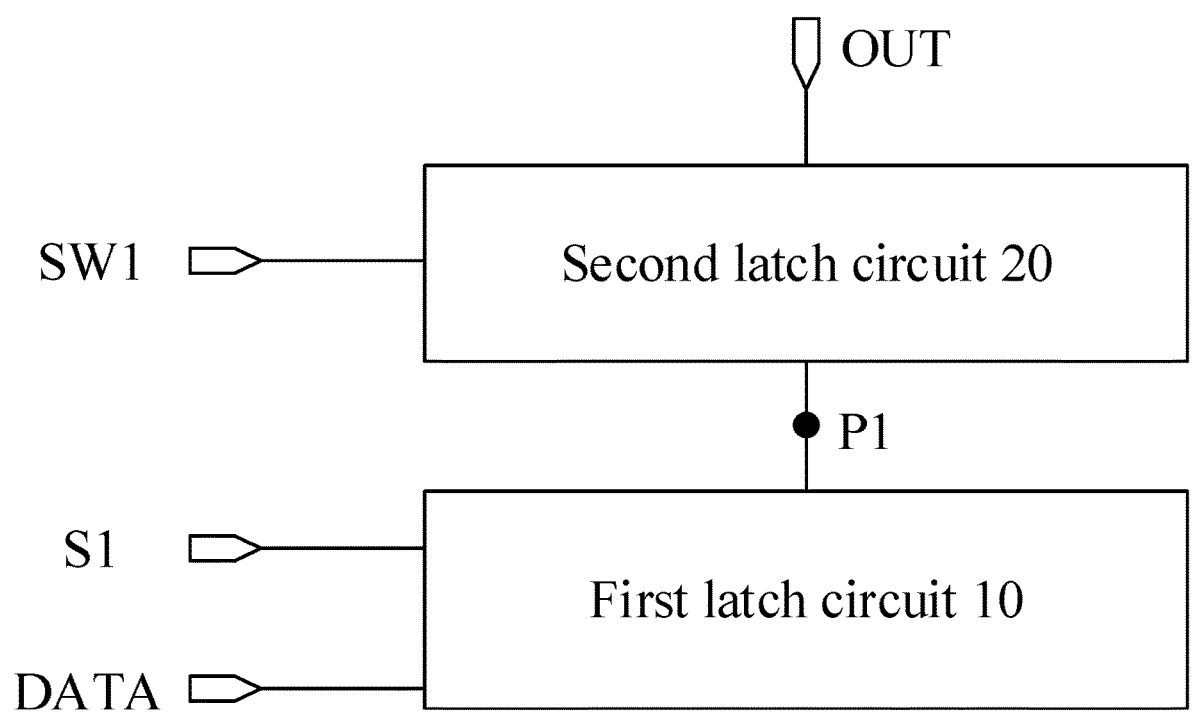
FIG. 1 is a schematic structural diagram of a latch according to an embodiment of the present disclosure.

FIG. 1 is a schematic structural diagram of a latch according to an embodiment of the present disclosure. As illustrated in FIG. 1, the latch may include: a first latch circuit 10 and a second latch circuit 20.

The first latch circuit 10 is connected to a first control signal terminal S1, a data signal terminal DATA and a transmission node P1, and is configured to, under control of a first pulse control signal from the first control signal terminal S1, latch a data signal from the data signal terminal DATA and transmit the data signal to the transmission node P1.

The second latch circuit 20 is connected to the transmission node P1, a first switch signal terminal SW1, and an output node OUT, and is configured to, under control of a first switch signal from the first switch signal terminal SW1, latch a data signal from the transmission node P1 and output the data signal to the output node OUT. A loop in the second latch circuit 20 is turned off the data signal to written to a latch node of the second latch circuit 20.

Figure 2:
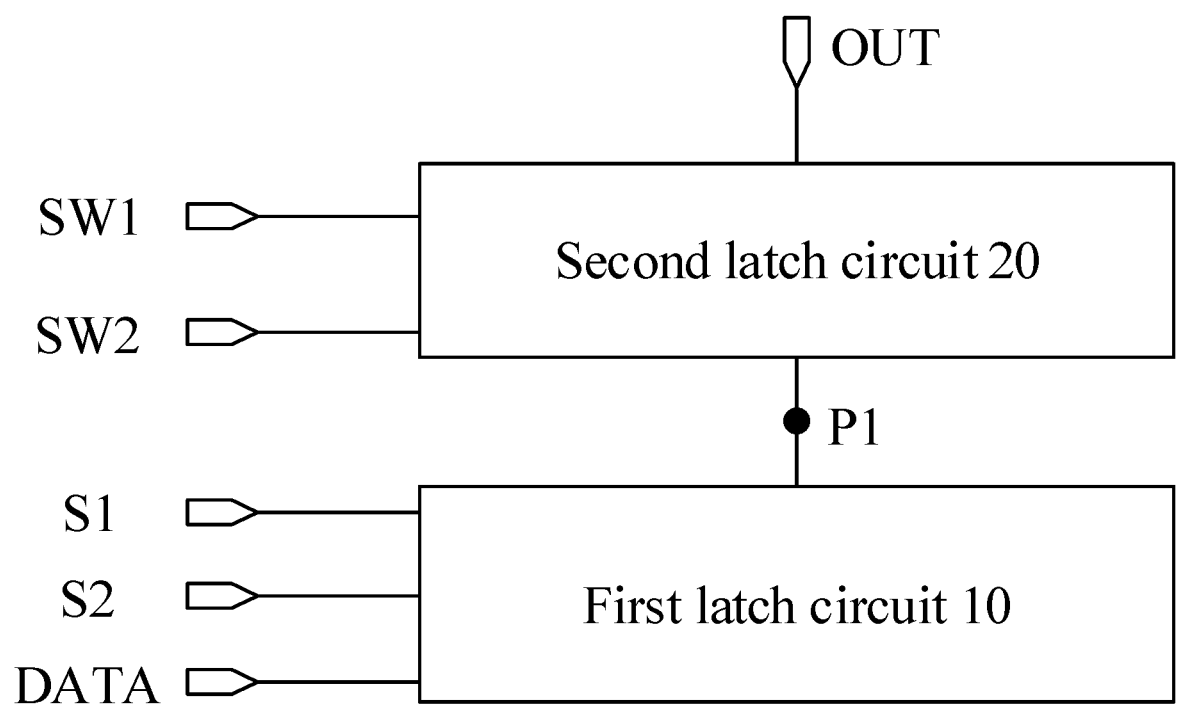
FIG. 2 is a schematic structural diagram of another latch according to an embodiment of the present disclosure.

FIG. 2 is a schematic structural diagram of another latch according to an embodiment of the present disclosure. As shown in FIG. 2, the first latch circuit 10 may be connected to a first control signal terminal S1, a second control signal terminal S2, a data signal terminal DATA and a transmission node P1, and is configured to, under control of a first pulse control signal from the first control signal terminal S1 and a second pulse control signal from the second control signal terminal S2, latch a data signal from the data signal terminal DATA and transmit the data signal to the transmission node P1.

The second latch circuit 20 may be connected to the transmission node P1, a first switch signal terminal SW1, a second switch signal terminal SW2 and an output node OUT, and is configured to, under control of a first switch signal from the first switch signal terminal SW1 and a second switch signal from the second switch signal terminal SW2, latch a data signal from the transmission node P1 and output the data signal to the output node OUT.

A loop in the second latch circuit 20 is turned off in response to the data signal written to a latch node of the second latch circuit 20.

In summary, an embodiment of the present disclosure provides a latch. The latch includes two cascaded latch circuits. The two latch circuits are connected via a transmission node, one of the latch circuits operates under control of two control signal terminals, and the other of the latch circuits operates under control of two switch signal terminals. The latch has a simpler structure and a higher drive flexibility. In addition, since a loop in the second latch circuit is turned off in response to a data signal written to a latch node of the second latch circuit, signals latched in the loop can be prevented from affecting write of the data signal, and normal write of the data signal is ensured.

Figure 3:
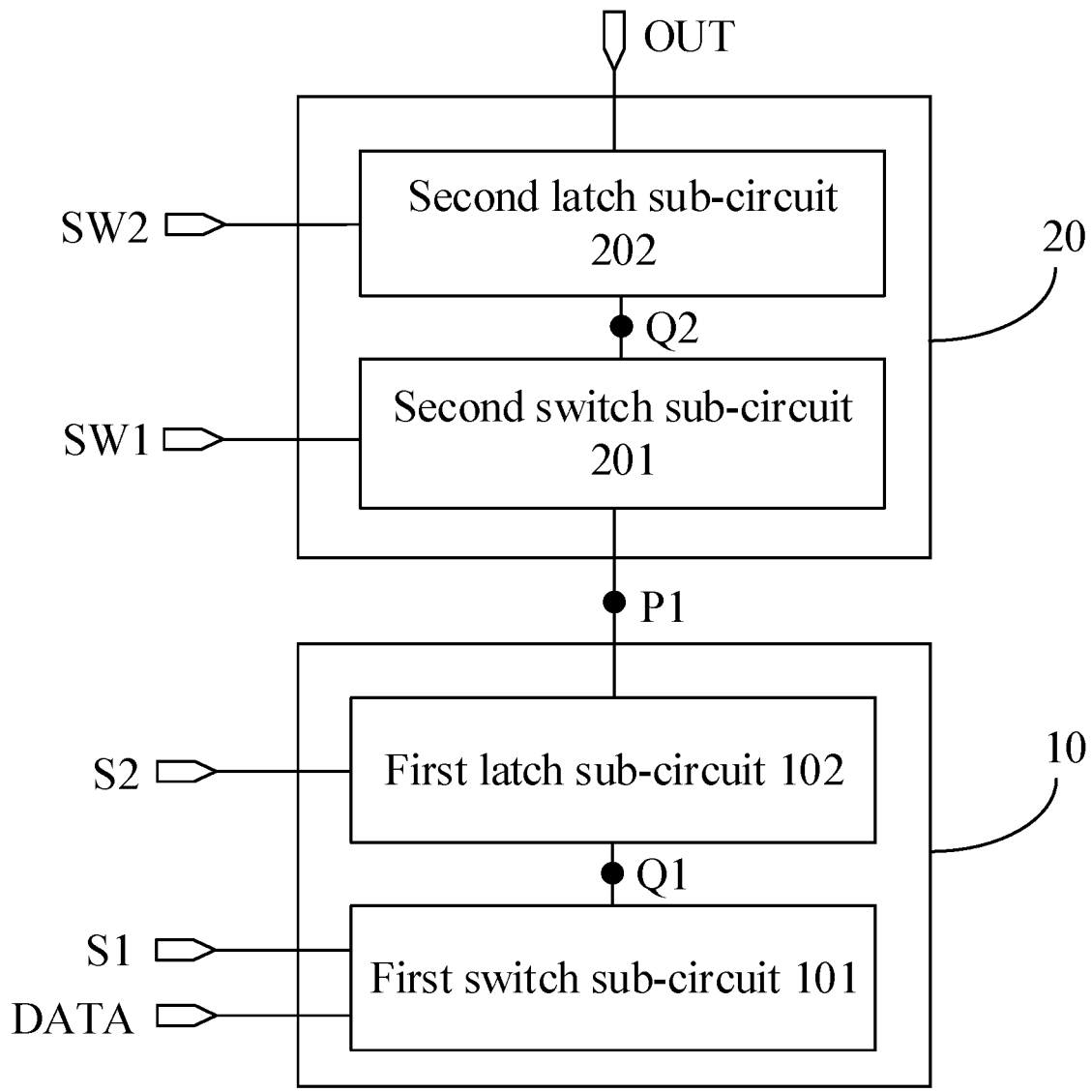
FIG. 3 is a schematic structural diagram of still another latch according to an embodiment of the present disclosure.

FIG. 3 is a schematic structural diagram of still another latch according to an embodiment of the present disclosure. As illustrated in FIG. 3, the first latch circuit 10 may include: a first switch sub-circuit 101 and a second latch sub-circuit 102.

The first switch sub-circuit 101 is connected to the first control signal terminal Si, the data signal terminal DATA and a first latch node Q1, and is configured to, under control of the first pulse control signal, transmit the data signal to the first latch node Q1.

For example, the first switch sub-circuit 101 may transmit the data signal to the first latch node Q1 when the first pulse control signal is at the first potential.

The first latch sub-circuit 102 is connected to the second control signal terminal S2, the first latch node Q1 and the transmission node P1, and is configured to, under control of the second pulse control signal, latch the data signal at the first latch node Q1 and transmit the data signal to the transmission node P1.

For example, the first latch sub-circuit 102 may latch the data signal at the first latch node Q1 and transmit the data signal to the transmission node P1 when the second pulse control signal is at the first potential.

Referring to FIG. 3, the second latch circuit 20 may include: a second switch sub-circuit 201 and a second latch sub-circuit 202.

The second switch sub-circuit 201 is connected to the first switch signal terminal SW1, the transmission node P1 and a second latch node Q2, and is configured to, under control of the first switch signal, transmit the data signal from the transmission node P1 to the second latch node Q2.

For example, the second switch sub-circuit 201 may transmit the data signal from the transmission node P1 to the second latch node Q2 when the first switch signal is at the first potential.

The second latch sub-circuit 202 is connected to the second switch signal terminal SW2, the second latch node Q2 and the output node OUT, and is configured to, under control of the second switch signal, latch the data signal at the second latch node Q2 and transmit the data signal to the output node OUT.

For example, the second latch sub-circuit 202 may latch the data signal at the second latch node Q2 and transmit the data signal to the output node OUT when the second switch signal is at the first potential.

Figure 4:
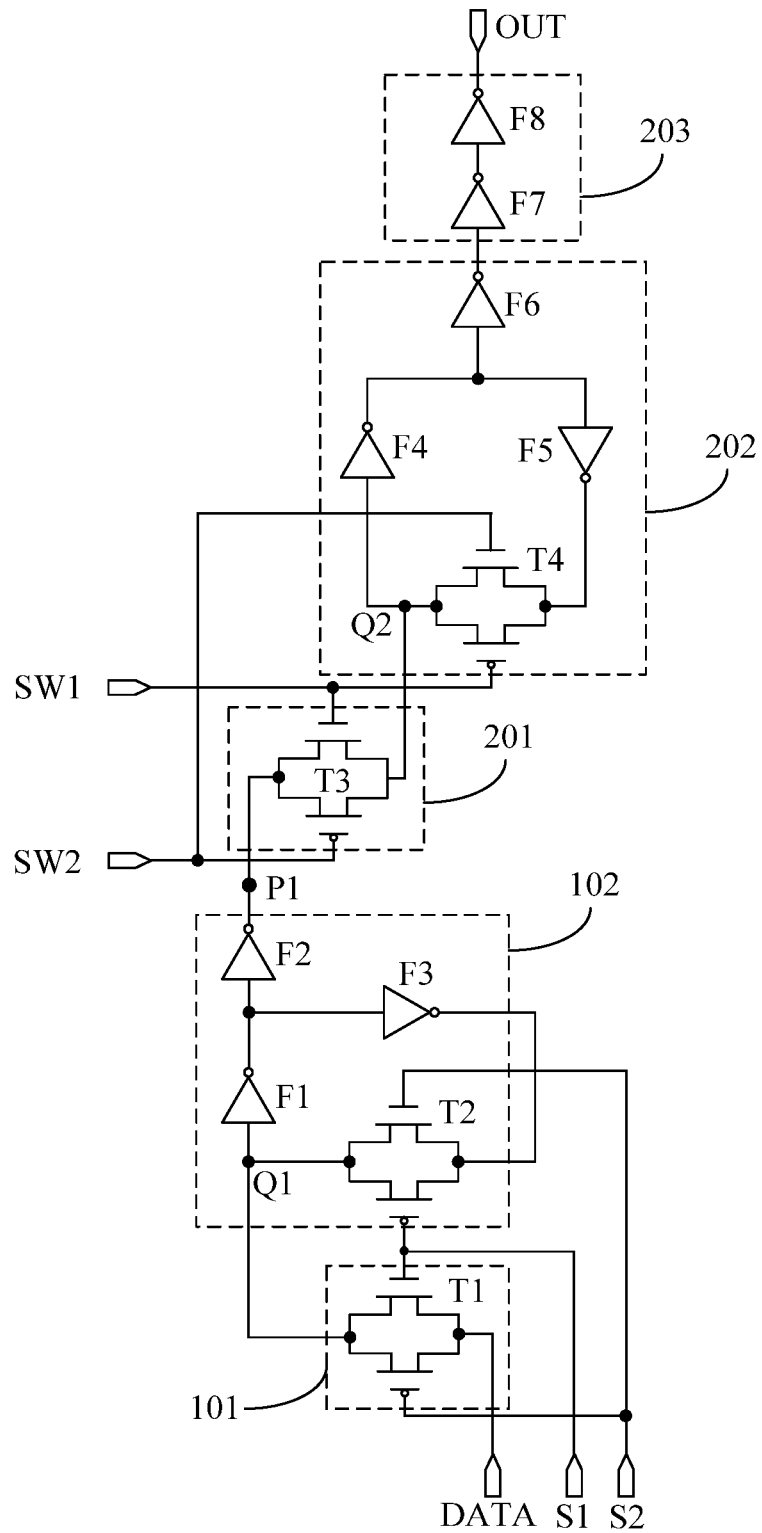
FIG. 4 is a schematic structural diagram of yet still another latch according to an embodiment of the present disclosure.

FIG. 4 is a schematic structural diagram of yet still another latch according to an embodiment of the present disclosure. As illustrated in FIG. 4, the first switch sub-circuit 101 may specifically include: a first transmission gate T1.

A first control terminal of the first transmission gate T1 is connected to the first control signal terminal S1, a second control terminal of the first transmission gate T1 is connected to the second control signal terminal S2, an input terminal of the first transmission gate T1 is connected to the data signal terminal DATA, and an output terminal of the first transmission gate T1 is connected to the first latch node Q1.

When the first pulse control signal output from the first control signal terminal S1 is at the first potential, and the second pulse control signal output from the second control signal terminal S2 is at the second potential, the first transmission gate T1 is turned on and the data signal terminal DATA may transmit the data signal to the first latch node Q1.

As illustrated in FIG. 4, the first latch sub-circuit 102 may specifically include: a second transmission gate T2, a first inverter F1, a second inverter F2 and a third inverter F3.

A first control terminal of the second transmission gate T2 is connected to the second control signal terminal S2, a second control terminal of the second transmission gate T2 is connected to the first control signal terminal S1, an input terminal of the second transmission gate T2 is connected to an output terminal of the third inverter F3, and an output terminal of the second transmission gate T2 is connected to the first latch node Q1.

An input terminal of the first inverter F1 is connected to the first latch node Q1, an output terminal of the first inverter F1 is connected to an input terminal of the second inverter F2 and an input terminal of the third inverter F3, and an output terminal of the second inverter F2 is connected to the transmission node P1.

When the first pulse control signal output from the first control signal terminal S1 is at the second potential and the second pulse control signal output from the second control signal terminal S2 is at the first potential, the second transmission gate T2 is turned on. As seen from FIG. 4, in response to the turning on of the transmission gate T2, the transmission gate T2, the first inverter F1 and the third inverter F3 may form a loop which may latch the potential of the first latch node Q1, that is, the loop may latch the data signal at the first latch node Q1. In addition, the first inverter F1 and the second inverter F2 may further transmit the data signal latched at the first latch node Q1 to the transmission node P1.

Still referring to FIG. 4, the second switch sub-circuit 201 may include: a third transmission gate T3.

A first control terminal of the third transmission gate T3 is connected to the first switch signal terminal SW1, a second control terminal of the third transmission gate T3 is connected to the second switch signal terminal SW2, an input terminal of the third transmission gate T3 is connected to the transmission node P1, and an output terminal of the third transmission gate T3 is connected to the second latch node Q2.

When the first switch signal output from the first switch signal terminal SW1 is at the first potential and the second switch signal output from the second switch signal terminal SW2 is at the second potential, the third transmission gate T3 is turned on and may transmit the data signal from the transmission node P1 to the second latch node Q2.

As illustrated in FIG. 4, the second latch sub-circuit 202 may include: a fourth transmission gate T4, a fourth inverter F4, a fifth inverter F5 and a sixth inverter F6.

A first control terminal of the fourth transmission gate T4 is connected to the second switch signal terminal SW2, a second control terminal of the fourth transmission gate T4 is connected to the first switch signal terminal SW1, an input terminal of the fourth transmission gate T4 is connected to an output terminal of the fifth inverter F5, and an output terminal of the fourth transmission gate T4 is connected to the second latch node Q2.

An input terminal of the fourth inverter F4 is connected to the second latch node Q2, an output terminal of the fourth inverter F4 is connected to an input terminal of the fifth inverter F5 and an input terminal of the sixth inverter F6, and an output terminal of the sixth inverter F6 is connected to the output node OUT.

When the first switch signal output from the first switch signal terminal SW1 is at the second potential and the second switch signal output from the second switch signal terminal SW2 is at the first potential, the fourth transmission gate T4 is turned on. As seen from FIG. 4, in response to the turning on of the fourth transmission gate T4, the fourth transmission gate T4, the fourth inverter F4 and the fifth inverter F5 form a loop which may latch the potential of the second latch node Q2, that is, the loop may latch the data signal at the second latch node Q2. In addition, the fourth inverter F4 may also transmit the data signal latched at the second latch node Q2 to the output node OUT.

In the operating process of the latch, the fourth transmission gate T4 may be controlled to be turned on or turned off through the first switch signal terminal SW1 and the second switch signal terminal SW2, thereby controlling the loop to be turned on or turned off.

In the embodiment of the present disclosure, as seen from FIG. 4, the connection between the third transmission gate T3 and the two switch signal terminals is inverse to the connection between the fourth transmission gate T4 and the two switch signal terminals. Therefore, when the third transmission gate T3 is turned on under control of the two switch signal terminals, the fourth transmission gate T4 is turned off. When the third transmission gate T3 is turned off under control of the two switch signal terminals, the fourth transmission gate T4 is turned on. Therefore, when the third transmission gate T3 is turned on and inputs the data signal to the second latch node Q2, the first switch signal terminal SW1 and the second switch signal terminal SW2 may control the fourth transmission gate T4 to be turned off, to cut off the loop, such that race and hazard between the signal latched in the loop and the data signal input by the third transmission gate T3 may be prevented. The race and hazard may refer to that the potential of a signal input to a node is inconsistent with the potential previously latched at the node and the potential of the signal which is input cannot be normally written to the node, thereby causing a phenomenon of instable potentials at the node. Especially, when the data signal has an insufficient drive capability or the third transmission gate T3 has an insufficient transmission capability, the fourth transmission gate T4 is turned off, which may prevent the failure of writing the data signal normally to the second latch node Q2. Further, after the data signal is written to the second latch node Q2, the fourth transmission gate T4 is controlled to be turned on, such that the loop is turned on and latches the data signal at the second latch node Q2.

It should be noted that in the latch as illustrated in FIG. 4, the fourth transmission gate T4 may be further connected in series between the output terminal of the fourth inverter F4 and the input terminal of the fifth inverter F5, that is, as long as it is ensured that the fourth transmission gate T4, the fourth inverter F4 and the fifth inverter F5 form a loop. The specific connection manner of the fourth transmission gate T4 is not limited in the embodiment of the present disclosure.

It should be further noted that, in the latch according to the embodiment of the present disclosure, each transmission gate is in a conduction state when the first control terminal is at the first potential and the second control terminal is at the second potential. Correspondingly, the first pulse control signal output from the first control signal terminal S1 and the second pulse control signal output from the second control signal terminal S2 may be complementary signals. The first switch signal output from the first switch signal terminal SW1 and the second switch signal output from the second switch signal terminal SW2 may also be complementary signals. Two complementary signals may refer to that when one signal is at the first potential, the other signal is at the second potential, and when one signal is at the second potential, the other signal is at the first potential.

Exemplary, the first control signal terminal S1 may be connected to the second control signal terminal S2 via an inverter circuit, such that it may be ensured that the second pulse control signal output from the second control signal terminal S2 is complementary to the first pulse control signal output from the first control signal terminal S1. That is, when the first pulse control signal is at the first potential, the second pulse control signal is at the second potential, and when the first pulse control signal is at the second potential, the second pulse control signal is at the first potential. Likewise, the first switch signal terminal SW1 may also be connected to the second switch signal terminal SW1 via an inverter circuit, such that it may be ensured that the second switch signal output from the second switch signal terminal SW2 is complementary to the first switch signal output from the first switch signal terminal SW1.

Figure 5:
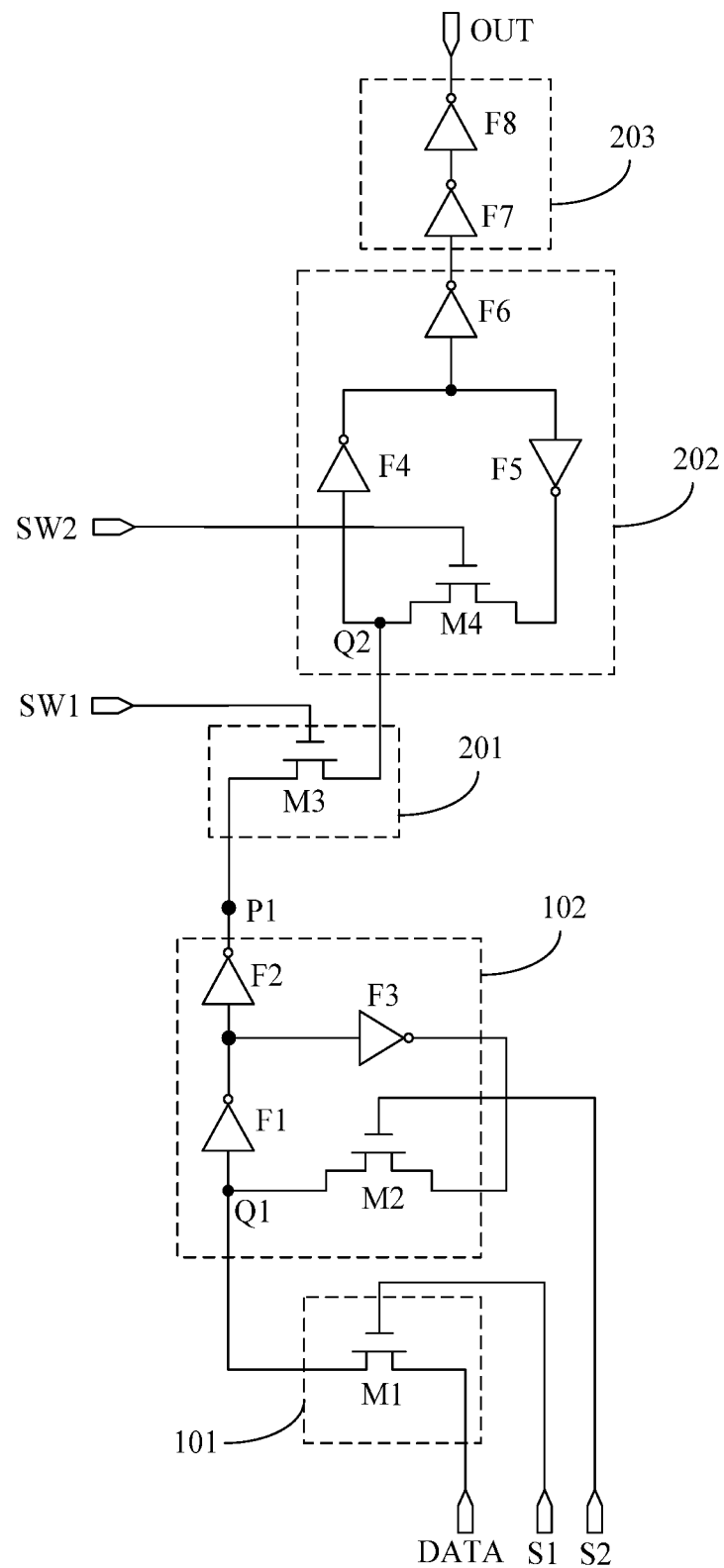
FIG. 5 is a schematic structural diagram of yet still another latch according to an embodiment of the present disclosure.

FIG. 5 is a schematic structural diagram of yet still another latch according to an embodiment of the present disclosure. As illustrated in FIG. 5, the first switch sub-circuit 101 may include: a first transistor M1.

A gate of the first transistor M1 is connected to the first control signal terminal S1, a first electrode of the first transistor M1 is connected to the data signal terminal DATA, and a second electrode of the first transistor M1 is connected to the first latch node Q1.

When the first pulse control signal output from the first control signal terminal S1 is at the first potential, the first transistor M1 is turned on, and the data signal terminal DATA may transmit the data signal to the first latch node Q1.

Optionally, as illustrated in FIG. 5, the first latch sub-circuit 102 may include: a second transistor M2, a first inverter F1, a second inverter F2 and a third inverter F3.

A gate of the second transistor M2 is connected to the second control signal terminal S2, a first electrode of the second transistor M2 is connected to an output terminal of the third inverter F3, and a second electrode of the second transistor M2 is connected to the first latch node Q1.

An input terminal of the first inverter F1 is connected to the first latch node Q1, an output terminal of the first inverter F1 is connected to an input terminal of the second inverter F2 and an input terminal of the third inverter F3, and an output terminal of the second inverter F2 is connected to the transmission node P1.

When the second pulse control signal output from the second control signal terminal S1 is at the first potential, the second transistor M2 is turned on. As illustrated in FIG. 5, the second transistor M2, the first inverter F1 and the third inverter F3 may form a loop which can latch the data signal at the first latch node Q1, and the first inverter F1 and the second inverter F2 may also transmit the data signal latched at the first latch node Q1 to the transmission node P1.

Still referring to FIG. 5, the second switch sub-circuit 201 may include: a third transistor M3.

A gate of the third transistor M3 is connected to the first switch signal terminal SW1, a first electrode of the third transistor M3 is connected to the transmission node P1, and a second electrode of the third transistor M3 is connected to the second latch node Q2.

When the first switch signal output from the first switch signal terminal SW1 is at the first potential, the third transistor M3 is turned on, and may transmit the data signal from the transmission node P1 to the second latch node Q2.

Optionally, as illustrated in FIG. 5, the second latch sub-circuit 202 may include: a fourth transistor M4, a fourth inverter F4, a fifth inverter F5 and a sixth inverter F6.

A gate of the fourth transistor M4 is connected to the second switch signal terminal SW2, a first electrode of the fourth transistor M4 is connected to an output terminal of the fifth inverter F5, and a second electrode of the fourth transistor M4 is connected to the second latch node Q2.

An input terminal of the fourth inverter F4 is connected to the second latch node Q2, an output terminal of the fourth inverter F4 is connected to an input terminal of the fifth inverter F5 and an input terminal of the sixth inverter F6, and an output terminal of the sixth inverter F6 is connected to the output node OUT.

When the second switch signal output from the second switch signal terminal SW2 is at the first potential, the fourth transistor M4 is turned on. As seen from FIG. 5, when the fourth transistor M4 is turned on, the fourth transistor M4, the fourth inverter F4 and the fifth inverter F5 form a loop, which can latch the data signal at the second latch node Q2, and the fourth inverter F4 may also transmit the data signal latched at the second latch node Q2 to the output node OUT.

In the structure as illustrated in FIG. 5, when the third transistor M3 is turned on and inputs the data signal to the second latch node Q2, the fourth transistor M4 may be controlled to be turned off through the second switch signal terminal SW2, to cut off the loop, such that race and hazard between the signal latched in the loop and the data signal input by the third transistor M3 may be prevented, and it is ensured that the data signal is normally written and latched at the second latch node Q2.

Figure 6:
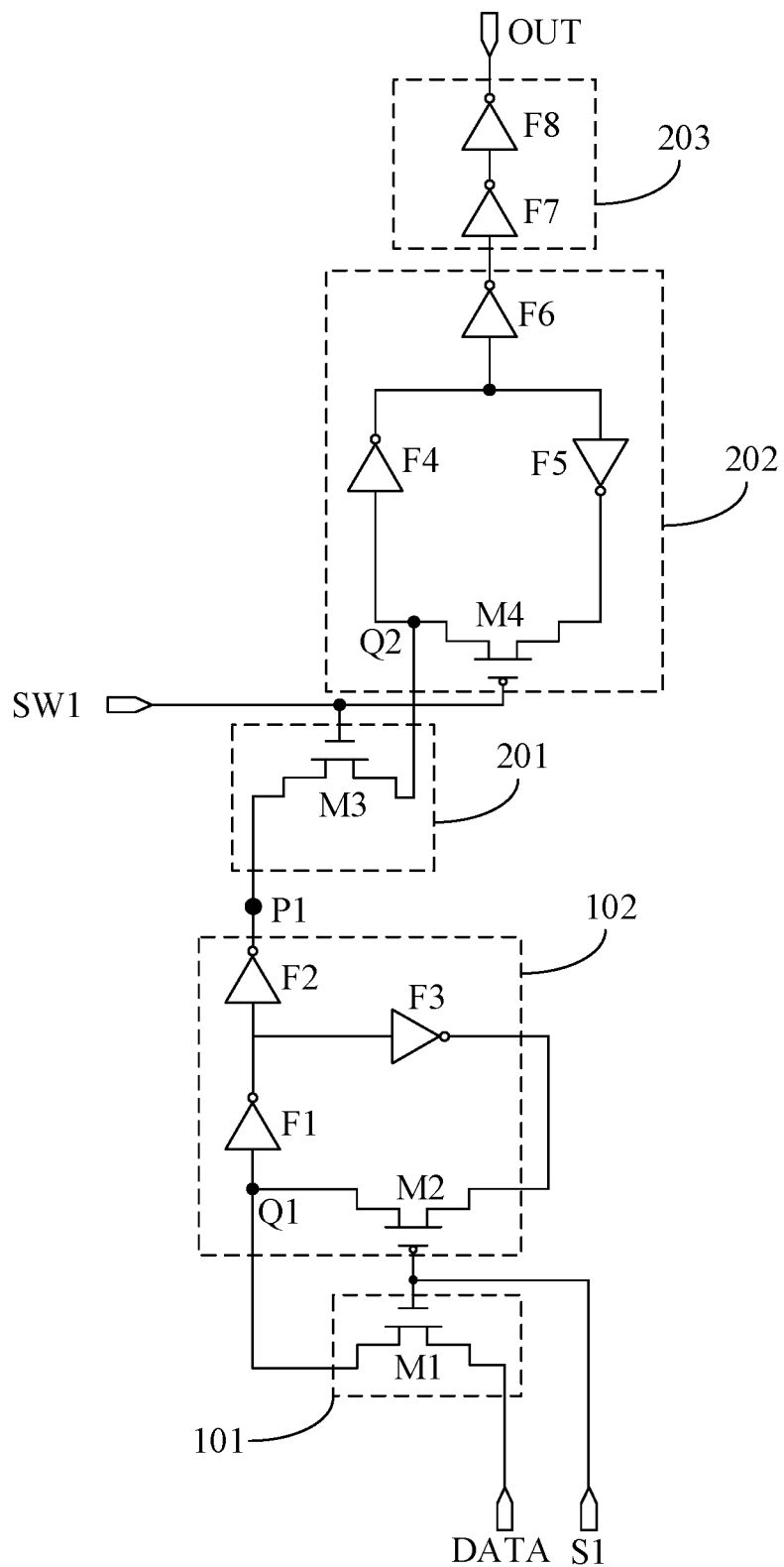
FIG. 6 is a schematic structural diagram of yet still another latch according to an embodiment of the present disclosure.

FIG. 6 is a schematic structural diagram of yet still another latch according to an embodiment of the present disclosure. As shown in FIG. 6, the first switch sub-circuit 101 may include: a first transistor M1; and the first latch sub-circuit 102 may include: a second transistor M2, a first inverter F1, a second inverter F2 and a third inverter F3. The first transistor M1 and the second transistor M2 have opposite polarities. For example, the first transistor M1 may be an N-type transistor, and the second transistor M2 may be a P-type transistor.

A gate of the first transistor M1 is connected to the first control signal terminal S1, a first electrode of the first transistor M1 is connected to the data signal terminal DATA, and a second electrode of the first transistor M1 is connected to the first latch node Q1.

A gate of the second transistor M2 is connected to the first control signal terminal S1, a first electrode of the second transistor M2 is connected to an output terminal of the third inverter F3, and a second electrode of the second transistor M2 is connected to the first latch node Q1.

An input terminal of the first inverter F1 is connected to the first latch node Q1, an output terminal of the first inverter F1 is connected to an input terminal of the second inverter F2 and an input terminal of the third inverter F3, and an output terminal of the second inverter F2 is connected to the transmission node P1.

When a first pulse control signal output from the first control signal terminal S1 is at a first potential, the first transistor M1 is turned on and the second transistor M2 is turned off, and the data signal terminal DATA may transmit the data signal to the first latch node Q1.

When a first pulse control signal output from the first control signal terminal S1 is at a second potential, the first transistor M1 is turned off and the second transistor M2 is turned on, and the second transistor M2 and the first inverter F3 may form a loop with the third inverter F3, such that the data signal can be latched at the first latch node Q1. In addition, the first inverter F1 and the second inverter F2 may further transmit the data signal latched at the first latch node Q1 to the transmission node P1.

Still referring to FIG. 5, the second switch sub-circuit 201 may include: a third transistor M3. The second latch sub-circuit 202 may include: a fourth transistor M4, a fourth inverter F4, a fifth inverter F5 and a sixth inverter F6. The third transistor M3 and the fourth transistor M4 have opposite polarities. For example, the third transistor M3 may be an N-type transistor, and the fourth transistor M4 may be a P-type transistor.

A gate of the third transistor M3 is connected to the first switch signal terminal SW1, a first electrode of the third transistor M3 is connected to the transmission node P1, and a second electrode of the third transistor M3 is connected to the second latch node Q2.

A gate of the fourth transistor M4 is connected to the first switch signal terminal SW1, a first electrode of the fourth transistor M4 is connected to an output terminal of the fifth inverter F5, and a second electrode of the fourth transistor M4 is connected to the second latch node Q2.

An input terminal of the fourth inverter F4 is connected to the second latch node Q2, an output terminal of the fourth inverter F4 is connected to an input terminal of the fifth inverter F45 and an input terminal of the sixth inverter F6, and an output terminal of the sixth inverter F6 is connected to the output node OUT.

When the first switch signal output from the first switch signal terminal SW1 is at the first potential, the third transistor M3 is turned on, the fourth transistor M4 is turned off, and the third transistor M3 may transmit the data signal from the transmission node P1 to the second latch node Q2.

When the second switch signal output from the first second signal terminal SW2 is at the first potential, the third transistor M3 is turned off, and the fourth transistor M4 is turned on. The fourth transistor M4 and the fourth inverter F4 form a loop with the fifth inverter F5, such that the data signal may be latched at the second latch node Q2. In addition, the fourth inverter F4 may further transmit the data signal latched at the second latch node Q2 to the output node OUT.

In the structure shown in FIG. 6, when the first switch signal terminal SW1 controls the third transistor M3 to be turned on and inputs the data signal to the second latch node Q2, the fourth transistor M4 is turned off, to turn off the loop, such that that race and hazard between the signal latched in the loop and the data signal input by the third transistor M3 may be prevented, and it is ensured that the data signal is normally written and latched at the second latch node Q2.

In addition, in the structure shown in FIG. 6, as only one first control signal terminal S1 is needed to implement control of the first switch sub-circuit 101 and the first latch sub-circuit 102, and only one first switch signal terminal SW1 is needed to implement control of the second switch sub-circuit 201 and the second latch sub-circuit 202, the circuit structure is effectively simplified and the power consumption for driving the latch reduces.

It should be noted that all of the transistors employed in the embodiment as illustrated in FIG. 3 to FIG. 6 may thin-film transistors or field-effect transistors or other devices having the same characteristics. According to the function in the circuit, the transistors employed in the embodiments of the present disclosure are mainly switch transistors. Since source and drain of the switch transistor employed herein are symmetric, the source and drain may be exchanged. In the embodiments of the present disclosure, the source is referred to as a first electrode and the drain is referred to as a second electrode. Alternatively, the drain may be referred to as a first electrode and the source may be referred to as a second electrode. According to morphology in the drawings, it is specified that the middle terminal of the transistor is the gate, the signal input terminal is the source, and the signal output terminal is the drain. In addition, the switch transistors employed in the embodiments of the present disclosure may include any one type of P-type switch transistors and N-type switch transistors (For example, the N-type switch transistors are used in the structure as illustrated in FIG. 5). Here, the P-type switch transistor is turned on when the gate of the P-type switch transistor is at a low potential, and is turned off when the gate of the P-type switch transistor is at a high potential The N-type switch transistor is turned on when the gate of the N-type switch transistor is at a high potential, and is turned off when the gate of the N-type switch transistor is at a low potential.

Further, as illustrated in FIG. 4 to FIG. 6, the second latch circuit 20 may further include: a buffer sub-circuit 203.

An input terminal of the buffer sub-circuit 203 may be connected to the second latch sub-circuit 202. For example, the input terminal of the buffer sub-circuit 203 may be connected to the output terminal of the sixth inverter F6. An output terminal of the buffer sub-circuit 203 may be connected to the output node OUT. That is, the second latch sub-circuit 202 may be connected to the output node OUT via the buffer sub-circuit 203.

Referring to FIG. 4 to FIG. 6, the buffer sub-circuit 203 may specifically include: a seventh inverter F7 and an eighth inverter F8 that are connected in series.

An input terminal of the seventh inverter F7 is connected to the output terminal of the sixth inverter F6, and an output terminal of the seventh inverter F7 is connected to an input terminal of the eighth inverter F8; and an output terminal of the eighth inverter F8 is connected to the output node OUT.

The buffer sub-circuit 203 formed by the plurality of inverters may ensure stability of the data signal finally output to a pixel unit.

As seen from FIG. 4, in the latch provided in the embodiment of the present disclosure, each transmission gate may be formed by two transistors that are connected in parallel, and these two transistors have opposite polarities.

In summary, an embodiment of the present disclosure provides a latch. The latch includes two cascaded latch circuits, which are connected via a transmission node. One of the latch circuits operates under control of two control signal terminals, and the other of the latch circuits operates under control of two switch signal terminals. The latch has a simpler structure and a higher drive flexibility. In addition, in the latch provided in the embodiment of the present disclosure, in response to the data signal transmitted to the latch node in the second latch circuit by the first latch circuit, the loop in the second latch circuit may be controlled to be turned off by the switch signal terminal, such that race and hazard between the signal previously latched in the loop and the data signal to be written may be prevented, the data signal is ensured to be normally written and latched, and reliability and stability of operation of the latch are improved.

Figure 7:
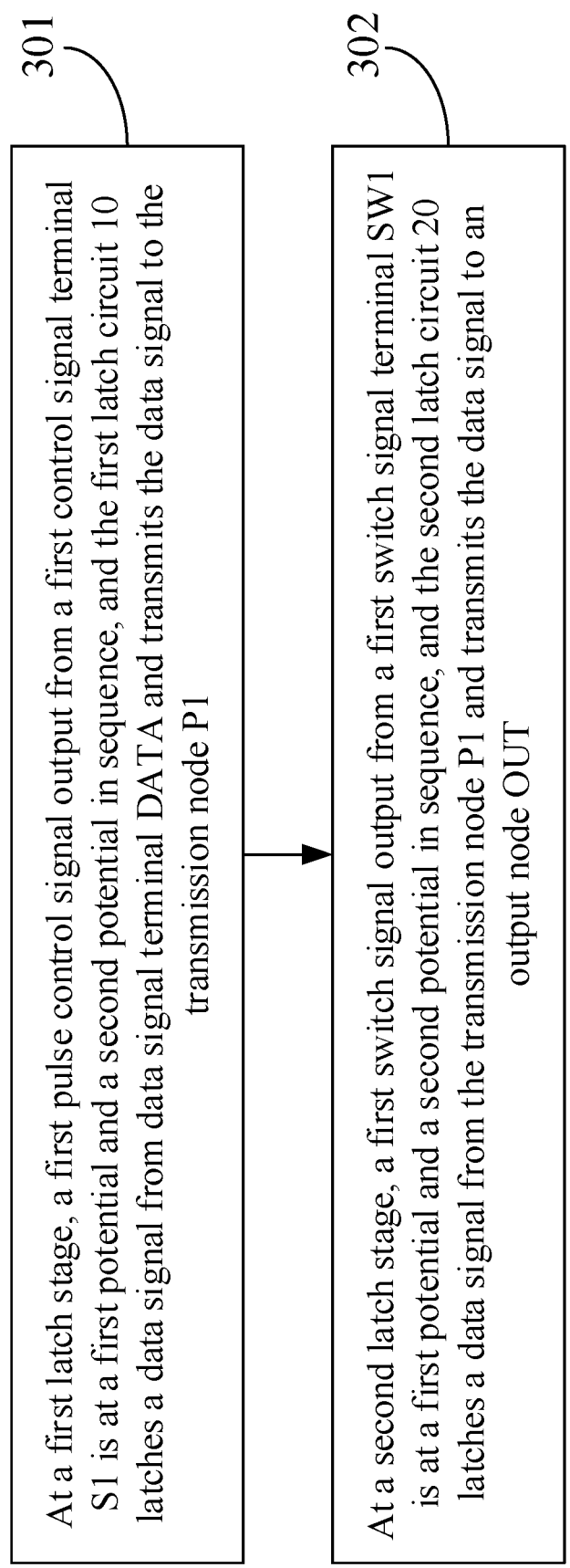
FIG. 7 is a flowchart of a method for driving a latch according to an embodiment of the present disclosure.

FIG. 7 is a flowchart of a method for driving a latch according to an embodiment of the present disclosure. The method may be applied to drive the latch as illustrated in any one of FIG. 1 to FIG. 6. Referring to FIG. 1 to FIG. 6, the latch may specifically include: a first latch circuit 10 and a second latch circuit 20. Referring to FIG. 7, the method may include the following steps.

In step 301, at a first latch stage, a first pulse control signal output from a first control signal terminal S1 is at a first potential and a second potential in sequence, and the first latch circuit 10 latches a data signal from data signal terminal DATA and transmits the data signal to the transmission node P1.

In step 302, at a second latch stage, a first switch signal output from a first switch signal terminal SW1 is at a first potential and a second potential in sequence, and the second latch circuit 20 latches a data signal from the transmission node P1 and transmits the data signal to an output node OUT.

At the second latch stage, a loop in the second latch circuit 20 is turned off in response to the data signal to written to the latch node of the second latch circuit 20. Thus, signals latched in the loop may be prevented from causing impacts on write of the data signal, and normal write of the data signal is ensured.

Figure 8:
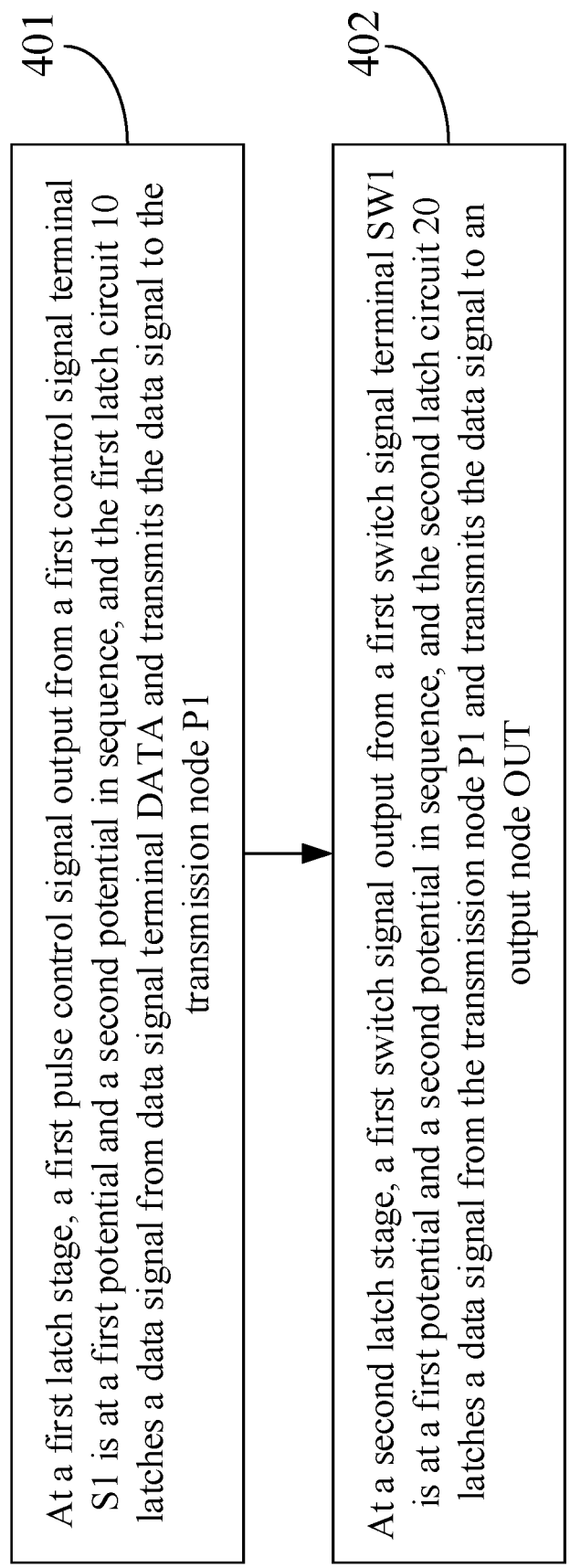
FIG. 8 is a flowchart of another method for driving a latch according to an embodiment of the present disclosure.

As an optional implementation, FIG. 8 is a flowchart of another method for driving a latch according to an embodiment of the present disclosure. This method may be applied to drive the latch as shown in any one of FIG. 2 to FIG. 5. Referring to FIG. 8, the method may include following steps.

In step 401, at a first latch stage, a first pulse control signal output from a first control signal terminal S1 and a second pulse control signal output from a second control signal terminal S2 are at the first potential in sequence, and the first latch circuit 10 latches a data signal from a data signal terminal DATA and transmits the data signal to a transmission node P1.

At the first latch stage, the second pulse control signal is at the second potential when the first pulse control signal is at the first potential, and the first pulse control signal is at the second potential when the second pulse control signal is at the first potential.

In step 402, at a second latch stage, a first switch signal output from a first switch signal terminal SW1 and a second switch signal output from a second switch signal terminal SW2 are at the first potential in sequence, and the second latch circuit 20 latches the data signal from the transmission node P1 and transmits the data signal to an output node OUT.

The second switch signal is at the second potential when the first switch signal is at the first potential, and the first switch signal is at the second potential when the second switch signal is at the first potential. In addition, at the second latch stage, a loop in the second latch circuit 20 is turned off in response to the data signal to a latch node of the second latch circuit 20. Thus, signals latched in the loop may be prevented from causing impacts on write of the data signal, and normal write of the data signal is ensured.

Optionally, as illustrated in FIG. 3, the first latch circuit 10 may include: a first switch sub-circuit 101 and the first latch sub-circuit 102. The second latch circuit 20 may include: a second switch sub-circuit 201 and a second latch sub-circuit 202.

Correspondingly, the first latch stage in step 401 may specifically include following sub-stages.

At an input sub-stage, the first pulse control signal is at the first potential, and the second pulse control signal, the first switch signal and the second switch signal are all at the second potential, and the first switch sub-circuit 101, under control of the first pulse control signal, transmits the data signal to the first latch node Q1.

At a first latch sub-stage, the first pulse control signal, the first switch signal and the second switch signal are all at the second potential and the second pulse control signal is at the first potential, and the first latch sub-circuit 102, under control of the second pulse control signal, latches the data signal at the first latch node Q1 and transmits the data signal to the transmission node P1.

The second latch stage in step 402 may include following sub-stages:

At a transmission sub-stage, the first switch signal is at the first potential, and the second switch signal, the first pulse control signal and the second pulse control signal are all is at the second potential, and the loop in the second latch sub-circuit 202 is turned off. The second switch sub-circuit 201, under control of the first switch signal, transmits the data signal from the transmission node P1 to the second latch node Q2.

At a second latch sub-stage, the first switch signal, the first pulse control signal and the second pulse control signal are all at the second potential and the second switch signal is at the first potential, and the loop in the second latch sub-circuit 202 is turned on. The second latch sub-circuit 202, under control of the second switch signal, latches the data signal at the second latch node Q2 and transmits the data signal to the output node OUT.

Figure 9:
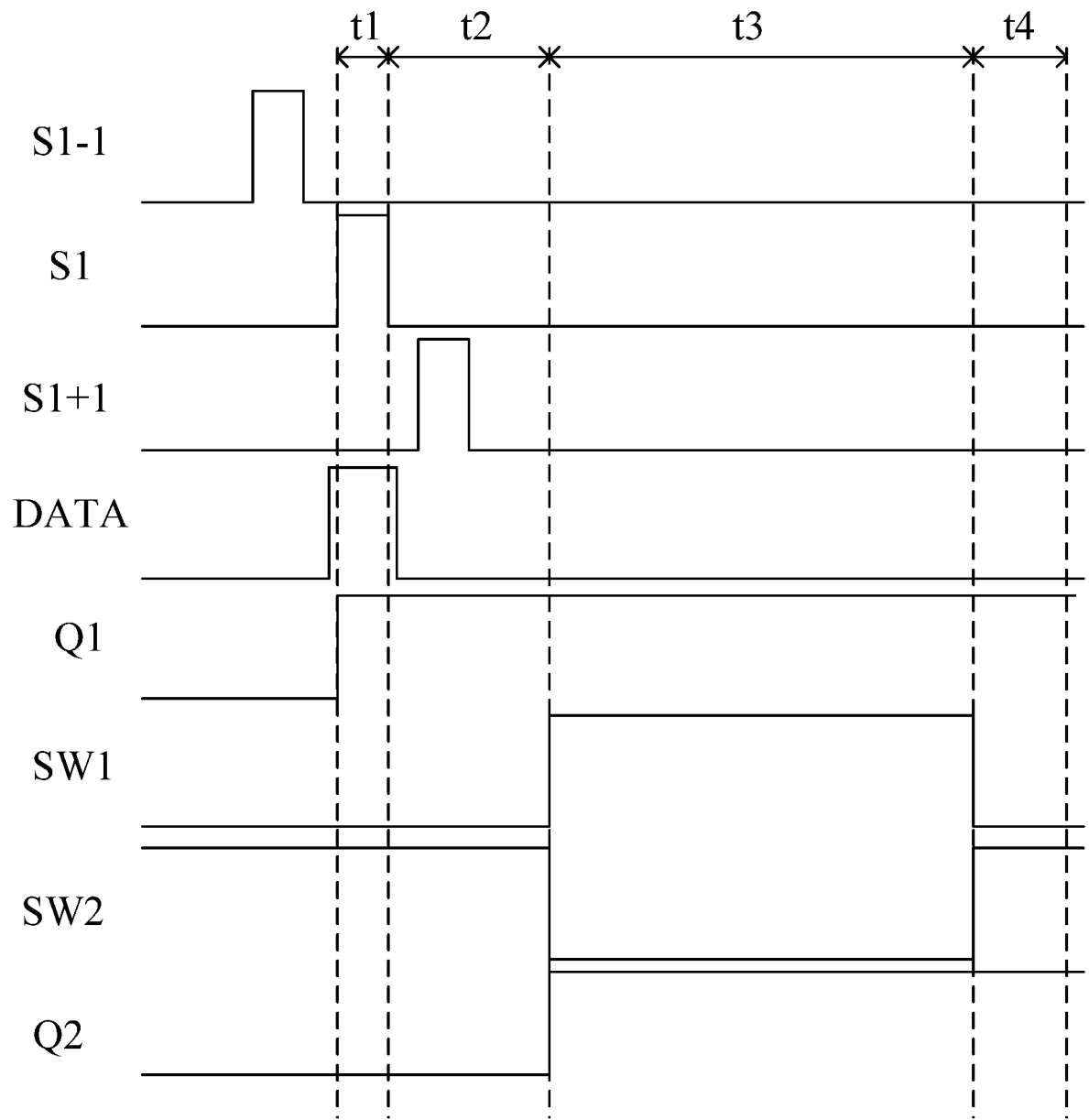
FIG. 9 is a timing sequence diagram of signal terminals in a latch according to an embodiment of the present disclosure.

FIG. 9 is a timing sequence diagram of signal terminals in a latch provided in an embodiment of the present disclosure. By taking the latch as illustrated in FIG. 4 as an example, the drive principle of the latch provided in the embodiment of the present disclosure is described hereinafter. The first control signal terminal S1 is connected to the second control signal terminal S2 via an inverter. That is, the second pulse control signal output from the second control signal terminal S2 is obtained by performing a negation operation for the first pulse control signal output from the first control signal terminal S1. The two pulse control signals are complementary to each other. As seen from FIG. 9, the first switch signal output from the first switch signal terminal SW1 is also complementary to the second switch signal output from the second switch signal terminal SW2.

Referring to FIG. 4 and FIG. 9, at the input sub-stage t1, the first pulse control signal provided by the first control signal terminal S1 is at the first potential. Correspondingly, the second pulse control signal provided by the second control signal terminal S2 is at the second potential, the first transmission gate T1 is turned on, the second transmission gate T2 is turned off, and the data signal terminal DATA writes the data signal to the first latch node Q1.

At the first latch sub-stage t2, the first pulse control signal output from the first control signal terminal S1 hops to the second potential. Correspondingly, the second pulse control signal is at the first potential, the first transmission gate T1 is turned off, and the second transmission gate T2 is turned on. In this case, the second transmission gate T2, the first inverter F1 and the third inverter F3 form a loop. That is, the loop formed by the second transmission gate T2, the first inverter F1 and the third inverter F3 is turned on, and latches the data signal at the first latch node Q1. In addition, since the data signal terminal DATA is disconnected from the first latch node Q1, potential changes at the data signal terminal DATA may be prevented from causing impacts on the potential latched at the first latch node Q1.

Meanwhile, in the input sub-stage t1 and the first latch sub-stage t2, the data signal at the first latch node Q1 may be transmitted to the transmission node P1 via the first inverter F1 and the second inverter F2. Referring to FIG. 9, since in the input sub-stage t1 and the first latch sub-stage t2, the switch signals output from the first switch signal terminal SW1 and the second switch signal terminal SW2 are both at the second potential, the third transmission gate T3 is turned off, the transmission node P1 is not conducted to the second latch node Q2, and thus the data signal cannot be transmitted to the second latch node Q2.

Further, in the transmission sub-stage t3, the first switch signal output from the first switch signal terminal SW1 is at the first potential, the second switch signal output from the second switch signal terminal SW2 is at the second potential, the third transmission gate T3 is turned on, the fourth transmission gate T4 is turned off, and the transmission node P1 transmits the data signal to the second latch node Q2. Since the fourth transmission gate T4 is turned off here and thus fails to form a loop with the fourth inverter F4 and the fifth inverter F5. That is, the loop formed by the fourth transmission gate T4, the fourth inverter F4 and the fifth inverter F5 is turned off, and thus the loop fails to latch the data that is written at the previous stage. Therefore, the data signal at the current transmission node P1 can be ensured to be normally written to the second latch node Q2.

In a latch in the related art, the loop in the second latch circuit is formed by two inverters. The loop is capable of latching the signal that is written at the previous stage, such that when the first latch circuit transmits the data signal to the second latch node Q2 in the second latch circuit, race and hazard may be caused between the data signal and the signal previously latched in the loop. As a result, the data signal cannot be normally written, and the latch operates abnormally.

Figure 10:
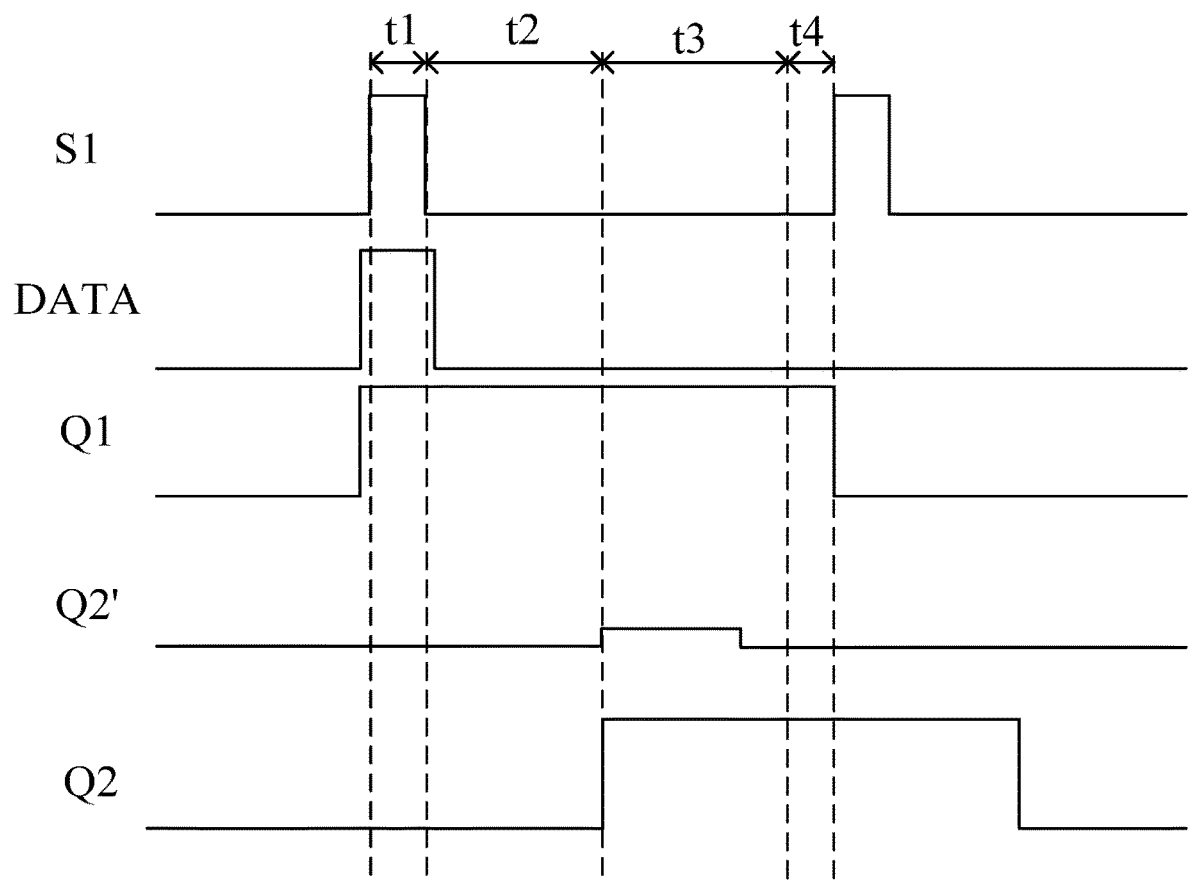
FIG. 10 is a diagram illustrating potential change comparison between a second latch node in a latch according to the embodiment of the present disclosure and a second latch node in a latch in the related art.

FIG. 10 is a diagram illustrating potential change comparison between the second latch node in the latch according to the embodiment of the present disclosure and a second latch node Q2' in the latch in the related art. As seen from FIG. 10, if the latch in the related art is employed, at the transmission sub-stage t3, when the transmission gate T3 has an insufficient transmission capability or the data signal has an insufficient drive capability, race and hazard occurs at the second latch node Q2'. As a result, the data signal input by the transmission node P1 fails to break through the original loop. That is, the data signal fails to be normally written to the second latch node Q2'. In the latch according to the embodiment of the present disclosure, since the loop is not formed in the second latch circuit at the transmission sub-stage t3, that is, the original loop in the second latch circuit is turned off, race and hazard does not occur at the second latch node Q2. As illustrated in FIG. 10, the data signal, under different drive capabilities, may be normally written to the second latch node Q2, such that stability of operation of the latch operates is ensured.

Further, at the second latch sub-stage t4, the first switch signal output from the first switch signal terminal SW1 is at the second potential, the second switch signal output from the second switch signal terminal SW2 is at the first potential, the third transmission gate T3 is turned off, and the fourth transmission gate T4 is turned off. In this case, the fourth transmission gate T4, the fourth inverter F4 and the fifth inverter F5 form a loop. That is, the loop formed by the fourth transmission gate T4, the fourth inverter F4 and the fifth inverter F5 is turned on, and the loop is capable of latching the data signal at the second latch node Q2. Since the transmission node P1 is disconnected from the second latch node Q2 at this time, stability of the potential of the second latch node Q2 can be ensured.

Meanwhile, at the second latch sub-stage t2, the data signal at the second latch node Q2 may be transmitted to the output node OUT via the sixth inverter F6 and the eighth inverter F8, and the output node OUT is connected to a data line. In the process of scanning pixel units row by row by a gate drive circuit, the data signal may be written to the corresponding pixel unit.

It should be noted that in the timing sequence diagram as illustrated in FIG. 9, the first control signal terminal S1 may be an output terminal of a first shift register unit at a stage in a horizontal shift register. The control signal terminal S1−1 may be an output terminal of a first shift register unit at a previous stage of the first shift register unit; and the control signal terminal S1+1 may be an output terminal of a first shift register unit at a next stage of the first shift register unit. As seen from FIG. 9, varied stages of first shift register units in the horizontal shift register may output in sequence pulse control signals at the first potential.

As another possible implementation, as shown in FIG. 6, the first latch circuit 10 may include: a first switch sub-circuit 101 and a first latch sub-circuit 102; the second latch circuit 20 may include: a second switch sub-circuit 201 and a second latch sub-circuit 202.

Correspondingly, the first latch stage as shown in step 301 may include following sub-stages.

At an input sub-stage, the first pulse control signal is at the first potential and the first switch signal is at the second potential, and the first switch sub-circuit 101 transmits the data signal to a first latch node Q1 under control of the first pulse control signal.

At a first latch sub-stage, the first pulse control signal is at the second potential and the first switch signal is at the second potential; and the first latch sub-circuit 102 latches the data signal at the first latch node Q1 and transmits the data signal to the transmission node P1 under control of the second pulse control signal.

The second latch stage as shown in step 402 may include following sub-stages.

At a transmission sub-stage, the first switch signal is at the first potential and the first pule control signal is at the second potential, and the loop in the second latch circuit 202 is turned off. The second switch sub-circuit 201 transmits the data signal from the transmission node P1 to a second latch node Q2 under control of the first switch signal.

At a second latch sub-stage, the first switch signal is at the second potential and the first pulse control signal is at the second potential, and the loop in the second latch circuit 202 is turned on. The second latch sub-circuit 202 latches the data signal at the second latch node Q2 and transmits the data signal to the output node OUT under control of the second switch signal.

The driving principle of the latch provided in the embodiments of the present disclosure is introduced by taking the latch as shown in FIG. 6 as an example. Here, the timing sequences of various signal terminals may still be made reference to FIG. 9.

With reference to FIG. 6 and FIG. 9, at the input sub-stage t1, the first pulse control signal provided by the first control signal terminal S1 is at the first potential and the first switch signal provided by the first switch signal terminal SW1 is at the second potential, the first transistor M1 is turned on, the second transistor M2 is turned off, and the data signal terminal DATA writes the data signal to the first latch node Q1.

At the first latch sub-stage t2, the first pulse control signal output from the first control signal terminal S1 hops to the second potential and the first switch signal maintains at the second potential, the first transistor M1 is turned off, and the second transistor M2 is turned on. In this case, the loop formed by the second transistor M2 and the first inverter F1 together with the third inverter F3 latches the data signal at the first latch node Q1. In addition, as the data signal terminal DATA is disconnected with the first latch node Q1, the change of the potential at the data signal terminal DATA may be prevented from affecting the potential latched by the first latch node Q1.

Meanwhile, at the input sub-stage t1 and the first latch sub-stage t2, the data signal at the first latch node Q1 may be transmitted to the transmission node P1 through the first inverter F1 and the second inverter F2. Referring to FIG. 9, as the first switch signal output from the first switch signal terminal SW1 is at the second potential at both the input sub-stage t1 and the first latch sub-stage t2, the fourth transistor M4 is turned on, the third transistor M3 is turned off, the transmission node P1 is not connected with the second latch node Q2, and data signal cannot be transmitted to the second latch node Q2.

At a transmission sub-stage t3, the first switch signal output from the first switch signal terminal SW1 is at the first potential and the first pule control signal output from the first control signal terminal S1 is at the second potential, the third transistor M3 is turned on and the fourth transistor M4 is turned off. The transmission node P1 transmits the data signal to the second latch node Q2. As the fourth transistor M4 is turned off in this case, the loop formed by the fourth transistor M4, the fourth inverter F4 and the fifth inverter F5 is turned off. The loop cannot latch the signal written in the previous stage. Thus, it is ensured that the data signal at the current transmission node P1 can be normally written to the second latch node Q2.

At a second latch sub-stage t4, the first switch signal output from the first switch signal terminal SW1 is at a second potential and the first pulse control signal output from the first control signal terminal S1 is at the second potential. The third transistor M3 is turned off and the fourth transistor M4 is turned on. In this case, the loop formed by the fourth transistor M4, the fourth inverter F4 and the fifth inverter F5 is turned on and can latch the data signal at the second latch node Q2. As the transmission node P1 is disconnected from the second latch node Q2 in this case, the stability of the potential at the second latch node Q2 is ensured.

Meanwhile, at the second latch sub-stage t4, the data signal at the second latch node Q2 may be transmitted to the output node OUT through the sixth inverter F6 to the eighth inverter F8, and the output node OUT is connected with a data line. During the process of scanning the pixel units row by row by the gate drive circuit, the data signal can be written to the corresponding pixel unit. It should be further noted that in the above embodiments, description is given by taking an example in which the first potential is a high potential relative to the second potential and the high potential is an active potential. Certainly, the first potential may also be a low potential relative to the second potential, and the low potential may be an active potential. In this case, in the structures as illustrated in FIG. 4 to FIG. 6, polarities of the transistors may be exchanged. For example, the N-type transistor in the latch as illustrated in FIG. 4 and FIG. 6 may be replaced with a P-type transistor, and the P-type transistor may be replaced with an N-type transistor. The transistors in the latch as illustrated in FIG. 5 may be replaced with P-type transistors.

Figure 11:
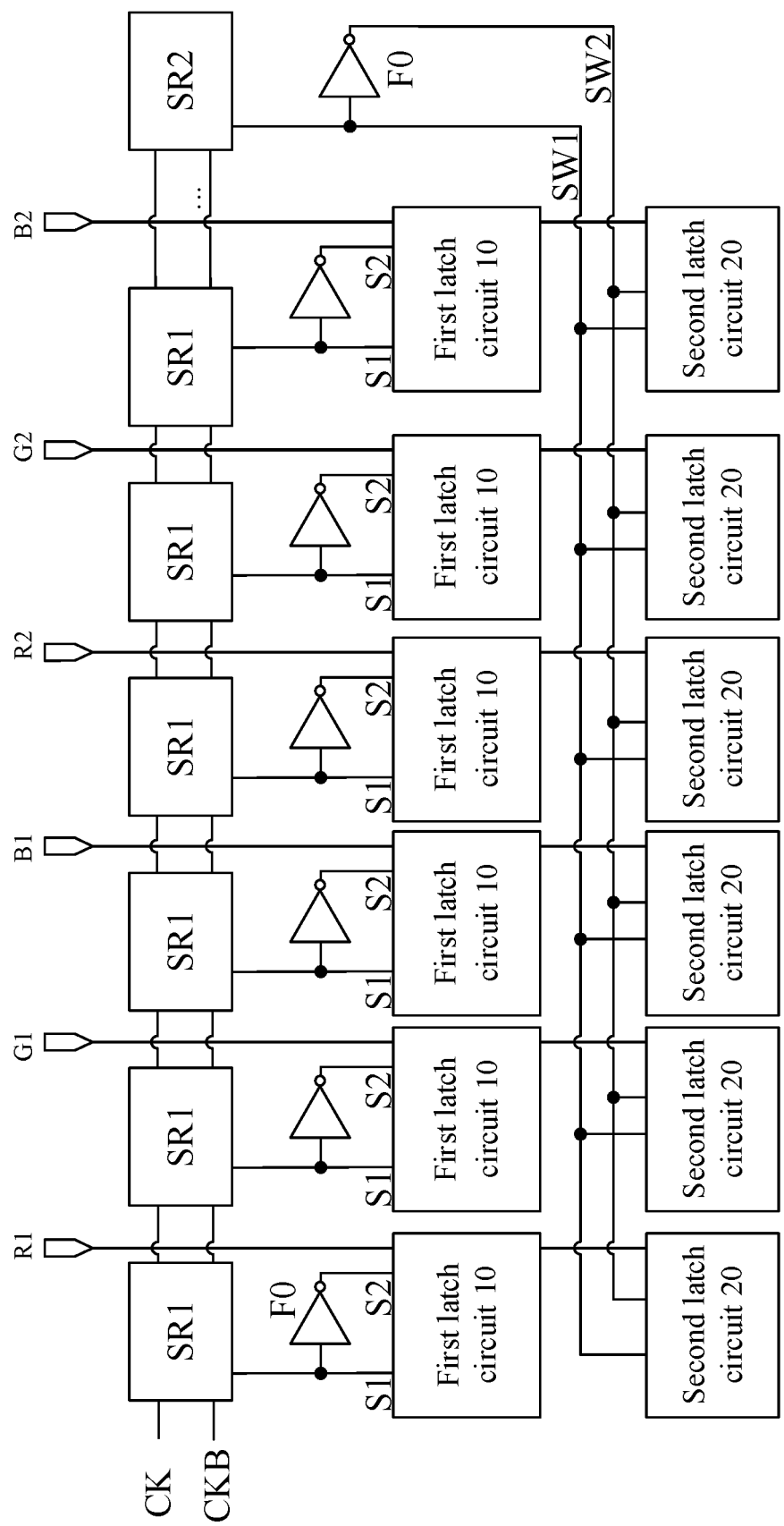
FIG. 11 is a schematic structural diagram of a source drive circuit according to an embodiment of the present disclosure.

FIG. 11 is a schematic structural diagram of a source drive circuit according to an embodiment of the present disclosure. As shown in FIG. 11, the source drive circuit may include: at least two cascaded first shift register units SR1 and at least two latches. Each latch includes a first latch circuit 10 and a second latch circuit 20. An output terminal of each first shift register unit SR1 is connected to the first control signal terminal S1 of a corresponding latch, and the latch may be the latch as illustrated in any one of FIG. 1 to FIG. 6.

Optionally, the first latch circuit 10 in each latch is further connected to a second control signal terminal S2. The source drive circuit may further include: a plurality of inverter circuits. The output terminal of each first shift register unit SR1 may further be connected to the second control signal terminal S2 of a corresponding latch via an inverter circuit. In this way, it may be ensured that the pulse control signals output from the two control signal terminals connected to each latch are complementary signals.

As shown in FIG. 11, each inverter circuit may include an inverter F0. An input terminal of the inverter F0 may be connected to the output terminal of a first shift register unit SR1, and an output terminal of the inverter F0 may be connected to the second control signal terminal S2 of a corresponding latch.

Optionally, as shown in FIG. 11, the source drive circuit may further include: a second shift register unit SR2 cascaded to a last stage first shift register unit SR1 in the at least two cascaded first shift register units SR1.

An output terminal of the second shift register unit SR2 is connected to a first switch signal terminal SW1 of each latch.

Optionally, the second latch circuit 20 in each latch may be further connected to a second switch signal terminal SW2. An output terminal of the second shift register unit SR2 may be further connected to the input terminal of an inverter F0. The output terminal of the inverter F0 may be connected to the second switch signal terminal SW2 of the second latch circuit 20 in each latch.

Still referring to FIG. 11, it can be known that the data signal terminals connected to various latches may be different. That is, various latches may be connected to various data signal terminals in parallel. For example, the first latch may be connected to a data signal terminal R1 configured to provide a data signal for red pixels, the second latch may be connected to a data signal terminal G1 configured to provide a data signal for green pixels, and the first latch may be connected to a data signal terminal B1 configured to provide a data signal for blue pixels.

An embodiment of the present disclosure further provides a display device. The display device may include the source drive circuit as described in the above embodiments, for example, the source drive circuit as shown in FIG. 11. The source drive circuit may include at least two cascaded first shift register units and at least two latches. An output terminal of each first shift register unit is connected to the first control signal terminal S1 of a corresponding latch. The latch may be the latch as illustrated in any of FIG. 1 to FIG. 6.

The display device may be: a liquid crystal panel, an electronic paper, an OLED panel, an AMOLED panel, a mobile phone, a tablet computer, a TV, a display, a laptop computer, a digital photo frame, a navigator or another product or part having a display function.

It should be noted that the display device according to the embodiment of the present disclosure may be a display device employing the memory in pixel (MIP) technology. With the MIP technology, a latch can be deployed in a display panel. Power consumption of the display device is greatly reduced by lowering a refresh frequency.

A person skilled in the art would clearly acknowledge that for convenience and conciseness of description, the specific operation processes of the above described latch and circuits may be made reference to the relevant portions in the above described method embodiments, which are not described herein any further.

Persons of ordinary skill in the art should understand that all or part of steps of the preceding methods may be implemented by hardware or hardware following instructions of programs. The programs may be stored in a non-transitory computer-readable storage medium, and may be executed by at least one processor. The storage medium may be a read only memory, a magnetic disk, or a read-only memory, disk or CD, etc.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A latch, comprising:
    a first latch circuit connected to a first control signal terminal, a data signal terminal and a transmission node, the first latch circuit configured to, under control of a first pulse control signal from the first control signal terminal, latch a data signal from the data signal terminal at a first latch node and transmit the data signal to the transmission node; and
    a second latch circuit connected to the transmission node, a first switch signal terminal and an output node, the second latch circuit configured to, under control of a first switch signal from the first switch signal terminal, latch a data signal from the transmission node at a second latch node and output the data signal to the output node;
    wherein a loop in the second latch circuit is turned off in response to the data signal written to the second latch node;
    the second latch circuit is further connected to a second switch signal terminal; the second latch circuit comprises: a second switch sub-circuit connected to the first switch signal terminal, the transmission node and the second latch node, the second switch sub-circuit configured to, under control of the first switch signal, transmit the data signal from the transmission node to the second latch node; and
    a second latch sub-circuit connected to the second switch signal terminal, the second latch node and the output node, the second latch sub-circuit configured to, under control of a second switch signal from the second switch signal terminal, latch the data signal at the second latch node and transmit the data signal to the output node.

2. The latch according to claim 1, wherein the first latch circuit is further connected to a second control signal terminal; the first latch circuit comprises:
    a first switch sub-circuit connected to the first control signal terminal, the data signal terminal and the first latch node, the first switch sub-circuit configured to, under control of the first pulse control signal, transmit the data signal to the first latch node; and
    a first latch sub-circuit connected to the second control signal terminal, the first latch node and the transmission node, the first latch sub-circuit configured to, under control of a second pulse control signal from the second control signal terminal, latch the data signal at the first latch node and transmit the data signal to the transmission node.

3. The latch according to claim 2, wherein the first switch sub-circuit comprises: a first transmission gate; the first latch sub-circuit comprises: a second transmission gate, a first inverter, a second inverter and a third inverter; wherein
    a first control terminal of the first transmission gate is connected to the first control signal terminal, a second control terminal of the first transmission gate is connected to the second control signal terminal, an input terminal of the first transmission gate is connected to the data signal terminal, and an output terminal of the first transmission gate is connected to the first latch node; a first control terminal of the second transmission gate is connected to the second control signal terminal, a second control terminal of the second transmission gate is connected to the first control signal terminal, an input terminal of the second transmission gate is connected to an output terminal of the third inverter, and an output terminal of the second transmission gate is connected to the first latch node; and
    an input terminal of the first inverter is connected to the first latch node, an output terminal of the first inverter is connected to an input terminal of the second inverter and an input terminal of the third inverter, and an output terminal of the second inverter is connected to the transmission node.

4. The latch according to claim 2, wherein the first switch sub-circuit comprises: a first transistor; the first latch sub-circuit comprises: a second transistor, a first inverter, a second inverter and a third inverter; wherein
    a gate of the first transistor is connected to the first control signal terminal, a first electrode of the first transistor is connected to the data signal terminal, and a second electrode of the first transistor is connected to the first latch node;
    a gate of the second transistor is connected to the second control signal terminal, a first electrode of the second transistor is connected to an output terminal of the third inverter, and a second electrode of the second transistor is connected to the first latch node; and
    an input terminal of the first inverter is connected to the first latch node, an output terminal of the first inverter is connected to an input terminal of the second inverter and an input terminal of the third inverter, and an output terminal of the second inverter is connected to the transmission node.

5. The latch according to claim 1, wherein the second switch sub-circuit comprises: a third transmission gate; the second latch sub-circuit comprises: a fourth transmission gate, a fourth inverter, a fifth inverter and a sixth inverter; wherein
- a first control terminal of the third transmission gate is connected to the first switch signal terminal, a second control terminal of the third transmission gate is connected to the second switch signal terminal, an input terminal of the third transmission gate is connected to the transmission node, and an output terminal of the third transmission gate is connected to the second latch node;
- a first control terminal of the fourth transmission gate is connected to the second switch signal terminal, a second control terminal of the fourth transmission gate is connected to the first switch signal terminal, an input terminal of the fourth transmission gate is connected to an output terminal of the fifth inverter, and an output terminal of the fourth transmission gate is connected to the second latch node; and
- an input terminal of the fourth inverter is connected to the second latch node, an output terminal of the fourth inverter is connected to an input terminal of the fifth inverter and an input terminal of the sixth inverter, and an output terminal of the sixth inverter is connected to the output node;
- wherein a loop, formed by the fourth transmission gate, the fourth inverter and the fifth inverter, is turned on in response to turning on of the fourth transmission gate.

6. The latch according to claim 1, wherein the second switch sub-circuit comprises: a third transistor; the second latch sub-circuit comprises: a fourth transistor, a fourth inverter, a fifth inverter and a sixth inverter; wherein
- a gate of the third transistor is connected to the first switch signal terminal, a first electrode of the third transistor is connected to the transmission node, and a second electrode of the third transistor is connected to the second latch node;
- a gate of the fourth transistor is connected to the second switch signal terminal, a first electrode of the fourth transistor is connected to an output terminal of the fifth inverter, and a second electrode of the fourth transistor is connected to the second latch node; and
- an input terminal of the fourth inverter is connected to the second latch node, an output terminal of the fourth inverter is connected to an input terminal of the fifth inverter and an input terminal of the sixth inverter, and an output terminal of the sixth inverter is connected to the output node;
- wherein a loop, formed by the fourth transistor, the fourth inverter and the fifth inverter, is turned on in response to turning on of the fourth transistor.

7. The latch according to claim 1, wherein the second latch circuit further comprises: a buffer sub-circuit; wherein
- an input terminal of the buffer sub-circuit is connected to the second latch sub-circuit, and an output terminal of the buffer sub-circuit is connected to the output node.

8. The latch according to claim 7, wherein the buffer sub-circuit comprises: a seventh inverter and an eighth inverter connected in series; wherein
- an input terminal of the seventh inverter is connected to the second latch sub-circuit, and an output terminal of the seventh inverter is connected to an input terminal of the eighth inverter; and
- an output terminal of the eighth inverter is connected to the output node.

9. A method for driving the latch according to claim 1, comprising:
- at a first latch stage, latching a data signal from a first data signal terminal at a first latch node and transmitting the data signal to a transmission node by the first latch circuit, wherein a first pulse control signal output from a first control signal terminal is at a first potential and a second potential in sequence; and
- at a second latch stage, latching a data signal from a transmission node at a second latch node and transmitting the data signal to an output node by the second latch circuit, wherein a first switch signal output from a first switch signal terminal is at a first potential and a second potential in sequence;
- wherein at the second latch stage, a loop in the second latch circuit is turned off in response to the data signal written to the second latch node.

10. The method according to claim 9, wherein the first latch circuit is further connected to a second control signal terminal; the second latch circuit is further connected to a second switch signal terminal; the first latch circuit comprises: a first switch sub-circuit and a first latch sub-circuit; the second latch circuit comprises: a second switch sub-circuit and a second latch sub-circuit; and the first latch stage comprises:
- at an input sub-stage, transmitting the data signal to the first latch node by the first switch sub-circuit under control of the first pulse control signal, wherein the first pulse control signal is at the first potential, and the first switch signal, a second pulse control signal output from a second control signal terminal and a second switch signal output from the second switch signal terminal are all at a second potential; and
- at a first latch sub-stage, latching the data signal at the first latch node and transmitting the data signal to the transmission node by the first latch sub-circuit under control of the second pulse control signal, wherein the first pulse control signal, the first switch signal and the second switch signal are all at the second potential and the second pulse control signal is at the first potential;
- wherein the first pulse control signal output from the first control signal terminal and the second pulse control signal output from the second control signal terminal are complementary signals; the second latch stage comprises:
- at a transmission sub-stage, transmitting the data signal from the transmission node to the second latch node by the second switch sub-circuit under control of the first switch signal, wherein the first switch signal, the first pulse control signal and the second pulse control signal are all at the first potential and the second switch signal is at a second potential, and a loop in the second latch sub-circuit is turned off; and
- at a second latch sub-stage, latching the data signal at the second latch node and transmitting the data signal to the output node by the second latch sub-circuit under control of the second switch signal, wherein the first switch signal, the first pulse control signal and the second pulse control signal are all at a second potential and the second switch signal is at the first potential, and the loop in the second latch sub-circuit is turned on;
- wherein the first switch signal output from the first switch signal terminal and the second switch signal output from the second switch signal terminal are complementary signals.

11. The method according to claim 9, wherein the first latch circuit comprises: a first switch sub-circuit and a first latch sub-circuit; the second latch circuit comprises: a second switch sub-circuit and a second latch sub-circuit; and the first latch stage comprises:

at an input sub-stage, transmitting the data signal to the first latch node by the first switch sub-circuit under control of the first pulse control signal, wherein the first pulse control signal is at the first potential and the first switch signal is at the second potential; and at a first latch sub-stage, latching the data signal at the first latch node and transmitting the data signal to the transmission node by the first latch sub-circuit under control of the second pulse control signal, wherein the first pulse control signal is at the second potential and the first switch signal is at the second potential;

the second latch stage comprises:

at a transmission sub-stage, transmitting the data signal from the transmission node to the second latch node by the second switch sub-circuit under control of the first switch signal, wherein the first switch signal is at the first potential and the first pule control signal is at the second potential; and at a second latch sub-stage, latching the data signal at the second latch node and transmitting the data signal to the output node by the second switch sub-circuit under control of the second switch signal, wherein the first switch signal is at the second potential, the first pulse control signal is at the second potential, and a loop in the second latch circuit is turned on.

12. The latch according to claim 1, wherein the first latch circuit comprises a first switch sub-circuit and a first latch sub-circuit; wherein the first switch sub-circuit comprises a first transistor; the first latch sub-circuit comprises a second transistor, a first inverter, a second inverter and a third inverter; the first transistor and the second transistor having opposite polarities;

wherein a gate of the first transistor is connected to the first control signal terminal, a first electrode of the first transistor is connected to the data signal terminal, and a second electrode of the first transistor is connected to the first latch node;

a gate of the second transistor is connected to the first control signal terminal, a first electrode of the second transistor is connected to an output terminal of the third inverter, and a second electrode of the second transistor is connected to the first latch node; and an input terminal of the first inverter is connected to the first latch node, an output terminal of the first inverter is connected to an input terminal of the second inverter and an input terminal of the third inverter, and an output terminal of the second inverter is connected to the transmission node.

13. The latch according to claim 12, wherein the second latch circuit comprises: a second switch sub-circuit, a second latch sub-circuit and a buffer sub-circuit; wherein the second switch sub-circuit comprises: a third transistor; the second latch sub-circuit comprises: a fourth transistor, a fourth inverter, a fifth inverter and a sixth inverter, the third transistor and the fourth transistor having opposite polarities; and the buffer sub-circuit comprises: a seventh inverter and an eighth inverter connected in series;

wherein a gate of the third transistor is connected to the first switch signal terminal, a first electrode of the third transistor is connected to the transmission node, and a second electrode of the third transistor is connected to the second latch node;

a gate of the fourth transistor is connected to the first switch signal terminal, a first electrode of the fourth transistor is connected to an output terminal of the fifth inverter, and a second electrode of the fourth transistor is connected to the second latch node; and an input terminal of the fourth inverter is connected to the second latch node, an output terminal of the fourth inverter is connected to an input terminal of the fifth inverter and an input terminal of the sixth inverter, and an output terminal of the sixth inverter is connected to an input terminal of the seventh inverter, and an output terminal of the seventh inverter is connected to an input terminal of the eighth inverter; and an output terminal of the eighth inverter is connected to the output node;

wherein a loop formed by the fourth transistor, the fourth inverter and the fifth inverter is turned on in response to turning on of the fourth transistor.

14. The latch according to claim 1, wherein the second latch circuit comprises: a second switch sub-circuit and a second latch sub-circuit; wherein the second switch sub-circuit comprises: a third transistor; the second latch sub-circuit comprises: a fourth transistor, a fourth inverter, a fifth inverter and a sixth inverter; the third transistor and the fourth transistor having opposite polarities;

wherein a gate of the third transistor is connected to the first switch signal terminal, a first electrode of the third transistor is connected to the transmission node, and a second electrode of the third transistor is connected to the second latch node;

a gate of the fourth transistor is connected to the first switch signal terminal, a first electrode of the fourth transistor is connected to an output terminal of the fifth inverter, and a second electrode of the fourth transistor is connected to the second latch node; and an input terminal of the fourth inverter is connected to the second latch node, an output terminal of the fourth inverter is connected to an input terminal of the fifth inverter and an input terminal of the sixth inverter, and an output terminal of the sixth inverter is connected to the output node;

wherein a loop, formed by the fourth transistor, the fourth inverter and the fifth inverter is turned on in response to turning on of the fourth transistor.

15. The latch according to claim 1, wherein the first pulse control signal is at a first potential at an input sub-stage in which the data signal is written to the first latch node;

the second pulse control signal is at the first potential in a first latch sub-stage which is after the input sub-stage in each period;

the first switch signal is at the first potential at a transmission sub-stage which is after the first latch sub-stage in each period, and the first switch signal is at a second potential that differs from the first potential at a second latch sub-stage which is after the transmission sub-stage in each period; and the second switch signal is at the second potential at the transmission sub-stage and at the first potential at the second latch sub-stage.

16. A source drive circuit, comprising:

at least two cascaded first shift register units and at least two latches, an output terminal of each of the first shift register units connected to a first control signal terminal of corresponding latch;

wherein the latch comprises:

a first latch circuit connected to a first control signal terminal, a data signal terminal and a transmission node, the first latch circuit configured to, under control of a first pulse control signal from the first control signal terminal, latch a data signal from the data signal terminal at a first latch node and transmit the data signal to the transmission node; and a second latch circuit connected to the transmission node, a first switch signal terminal, and an output node, the second latch circuit configured to, under control of a first switch signal from the first switch signal terminal, latch a data signal from the transmission node at a second latch node and output the data signal to the output node;

wherein a loop in the second latch circuit is turned off in response to the data signal written to the second latch node;

the second latch circuit is further connected to a second switch signal terminal; the second latch circuit comprises: a second switch sub-circuit connected to the first switch signal terminal, the transmission node and the second latch node, the second switch sub-circuit configured to, under control of the first switch signal, transmit the data signal from the transmission node to the second latch node; and a second latch sub-circuit connected to the second switch signal terminal, the second latch node and the output node, the second latch sub-circuit configured to, under control of a second switch signal from the second switch signal terminal, latch the data signal at the second latch node and transmit the data signal to the output node.

17. The source drive circuit according to claim 16, wherein the first latch circuit is further connected to a second control signal terminal; the source drive circuit further comprising: a plurality of inverter circuits; wherein the output terminal of each of the first shift register units is further connected to a second control signal terminal of corresponding latch via an inverter circuit.

18. The source drive circuit according to claim 17, wherein each of the inverter circuits comprises: an inverter; wherein an input terminal of the inverter is connected to an output terminal of one first shift register unit, and an output terminal of the inverter is connected to a second control signal terminal of a corresponding latch.

19. A display device, comprising the source drive circuit according to claim 16.

20. The source drive circuit according to claim 16, further comprising: a second shift register unit cascaded to a last stage first shift register unit the at least two cascaded first shift register units;

wherein an output terminal of the second shift register unit is connected to a first switch signal terminal of each of the at least two latches.

* * * * *